(12) United States Patent
McLaren et al.

(10) Patent No.: US 9,966,903 B1
(45) Date of Patent: May 8, 2018

(54) DOHERTY ARCHITECTURE FOR WIDEBAND POWER AMPLIFIER DESIGN

(71) Applicant: NXP USA, Inc., Austin, TX (US)

(72) Inventors: Roy McLaren, Gilbert, AZ (US); Hector Julian De La Rosa, Järfälla (SE)

(73) Assignee: NXP USA, Inc., Austin, TX (US)

( * ) Notice: Subject to any disclaimer, the term of this patent is extended or adjusted under 35 U.S.C. 154(b) by 0 days. days.

(21) Appl. No.: 15/635,800

(22) Filed: Jun. 28, 2017

Related U.S. Application Data

(60) Provisional application No. 62/440,442, filed on Dec. 30, 2016.

(51) Int. Cl.
*H03F 1/07* (2006.01)
*H03F 1/02* (2006.01)
(Continued)

(52) U.S. Cl.
CPC ............ *H03F 1/0288* (2013.01); *H03F 1/56* (2013.01); *H03F 3/195* (2013.01); *H03F 3/211* (2013.01);
(Continued)

(58) Field of Classification Search
CPC ......... H03F 1/07; H03F 1/0288; H03F 1/3252
(Continued)

(56) References Cited

U.S. PATENT DOCUMENTS 6,262,629 B1 * 7/2001 Stengel ................ H03F 1/0261
330/124 R
6,617,929 B2 9/2003 Kim et al.
(Continued)

FOREIGN PATENT DOCUMENTS

EP 2634916 A1 4/2013
WO 2015049620 A1 4/2015

OTHER PUBLICATIONS

Grebennikov, Andrei, "Multiband Doherty Amplifiers for Wireless Applications," wwww.highfrequencyelectronics.com, 2014 HFE, 16 pages.
(Continued)

*Primary Examiner* — Henry Choe

(57) ABSTRACT

Embodiments of a Doherty amplifier device are provided, where the device includes a main amplifier that produces a first RF signal with a variable first output power and a peaking amplifier that produces a second RF signal with a variable second output power equivalent to the first output power multiplied by a power ratio n greater than one; first and second RF signals combined in phase at a combining node; and a main output matching network (OMN), wherein the main OMN forms a portion of an equivalent main path transmission line having a characteristic impedance equivalent to $$\sqrt{(n+1) \cdot Ropt \cdot R0},$$

wherein Ropt is a load impedance seen at the main amplifier intrinsic current generator plane during a full power condition of the Doherty amplifier device and R0 is a load impedance seen at the combining node during a back-off power condition of the Doherty amplifier device.

21 Claims, 11 Drawing Sheets

(51) Int. Cl.
*H03F 3/21* (2006.01)
*H03F 3/195* (2006.01)
*H03F 1/56* (2006.01)

(52) U.S. Cl.
CPC ............ *H03F 2200/451* (2013.01); *H03F 2203/21103* (2013.01); *H03F 2203/21106* (2013.01); *H03F 2203/21139* (2013.01)

(58) Field of Classification Search
USPC .............................................. 330/295, 124 R
See application file for complete search history.

(56) References Cited

U.S. PATENT DOCUMENTS

| | | | | |
|---|---|---|---|---|
| 7,847,630 B2 * | 12/2010 | Okubo | .................. | H03F 1/0288 330/124 R |
| 7,973,600 B2 * | 7/2011 | Yu | ........................ | H03F 1/0288 330/124 R |
| 9,154,094 B2 * | 10/2015 | Mohamed | ............... | H03F 3/602 |
| 2004/0113698 A1 | 6/2004 | Kim et al. | | |
| 2013/0099866 A1 | 4/2013 | Conradi | | |
| 2018/0006611 A1 * | 1/2018 | de Jong | ................ | H03F 1/0288 |

OTHER PUBLICATIONS

Grebennikov et al., "A Dual-Band Parallel Doherty Power Amplifier for Wireless Applications," IEEE Transactions on Microwave Theory and Techniques, vol. 60, No. 10, Oct. 2012, 10 pages.

Barakat et al, "Towards generalized Doherty power amplifier design for multiband operation," IEEE 2015, Queen's University of Belfast, 6 pages.

Pengelly et al., "Doherty's Legacy," IEEE Microwave Magazine, Jan. 14, 2016, pp. 41-58.

Notice of Allowance on U.S. Appl. No. 15/635.971, dated Mar. 27, 2018, 11 pages.

* cited by examiner

US 9,966,903 B1

DOHERTY ARCHITECTURE FOR WIDEBAND POWER AMPLIFIER DESIGN

CROSS-REFERENCE TO RELATED APPLICATION

The present application claims the benefit of U.S. Provisional Application No. 62/440,442, filed on Dec. 30, 2016, which is incorporated by reference in its entirety. The present application is also co-pending with application Ser. No. 15/635,971, having a same filing date and same inventors as the present application.

BACKGROUND

Field

This disclosure relates generally to electronic circuits including radio frequency (RF) power amplifiers, and more specifically, to a Doherty amplifier device capable of wideband frequency operation.

Related Art

The conventional Doherty amplifier is extensively used in wireless communication, as it provides high efficiency for modern modulation techniques. However, conventional Doherty amplifiers are often bandwidth-limited, which makes implementation of a device having an extended operational frequency range overly burdensome.

BRIEF DESCRIPTION OF THE DRAWINGS

The present invention may be better understood, and its numerous objects, features, and advantages made apparent to those skilled in the art by referencing the accompanying drawings.

The present invention is illustrated by way of example and is not limited by the accompanying figures, in which like references indicate similar elements, unless otherwise noted.

Figure 1:
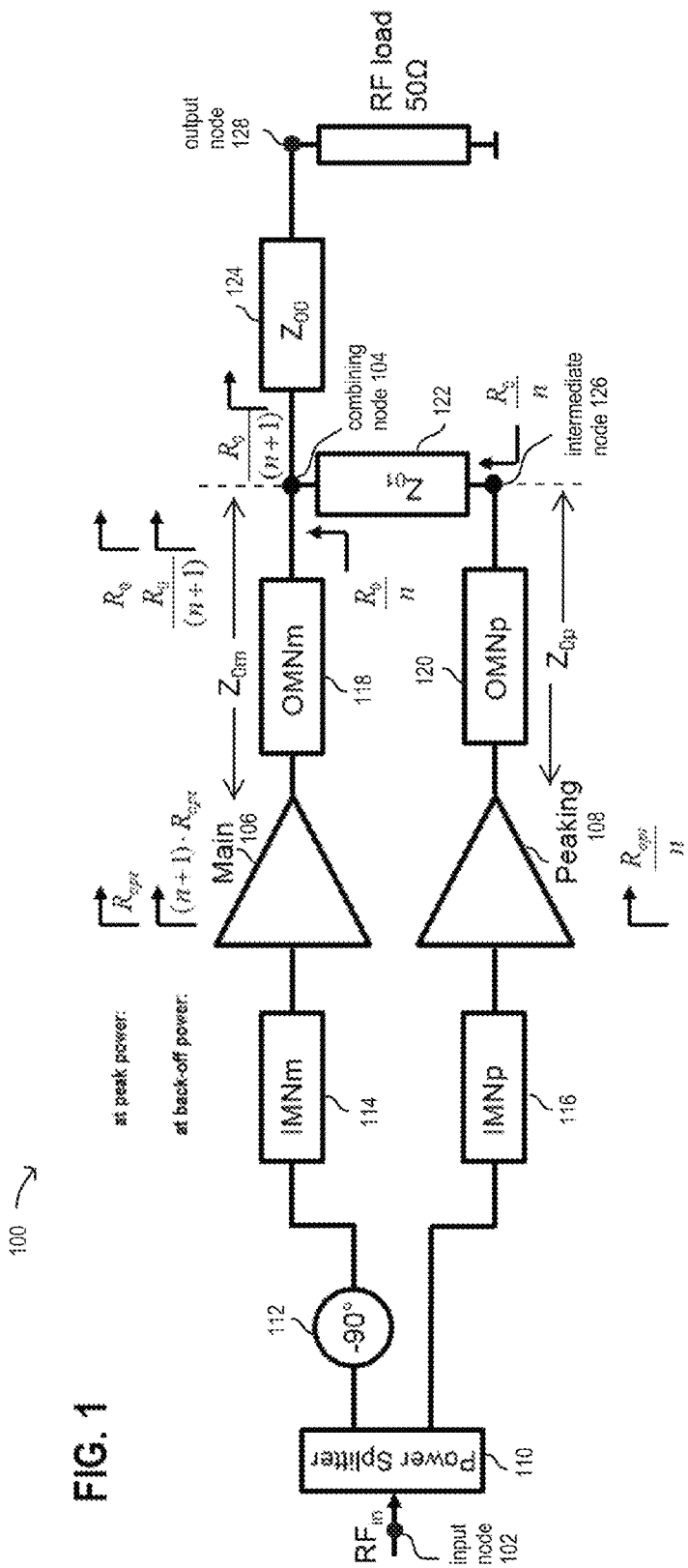
FIG. 1 illustrates a block diagram depicting an example "inverted" Doherty amplifier.

Elements in the figures are illustrated for simplicity and clarity and have not necessarily been drawn to scale.

DETAILED DESCRIPTION

The following sets forth a detailed description of various embodiments intended to be illustrative of the invention and should not be taken to be limiting.

Overview

Doherty power amplifier architectures have become popular in telecommunications systems due to their relatively high linearity and efficiency at back-off power levels, when compared with other types of amplifier topologies. A conventionally configured two-way Doherty power amplifier includes a class-AB biased carrier (or "main") amplifier and a class-C biased peak (or "peaking") amplifier in a parallel arrangement. An input signal is split (e.g., using a 3- or other decibel (dB) power splitter) between the main and peaking amplifier paths. When the input signal has relatively low to moderate power, the main amplifier operates to amplify the input signal, and the peaking amplifier is minimally conducting (e.g., the peaking amplifier is essentially in an off state at back-off power levels). As the input signal power increases to a level at which the main amplifier reaches voltage saturation and the peaking amplifier is conducting (e.g., the peaking amplifier turns on), and both amplifiers operate to amplify their respective portion of the input signal. Ultimately, the amplified RF signals are combined in phase at a combining node to produce the final amplified output signal.

The key operational aspect of a Doherty amplifier is the active load modulation of the main amplifier via the peaking amplifier, allowing the Doherty amplifier to operate with higher efficiency over an extended dynamic range. As the power level of the input signal increases beyond the point at which the main amplifier is operating in compression, the peaking amplifier conduction also increases, thus supplying more current to the load. In response, the load line impedance of the main amplifier output decreases. In fact, an impedance modulation effect occurs in which the load line of the main amplifier changes dynamically in response to the input signal power (i.e., the peaking amplifier provides active load pulling to the main amplifier). An impedance inverter, which is coupled between the output of the main amplifier and the combining node, ensures that the main amplifier sees a high value load line impedance at back-off power levels, allowing the main amplifier to efficiently supply power to the load over an extended output power range.

According to the operating principles of a Doherty amplifier, the correct load modulation characteristic can be established by the impedance inverter coupled between the main amplifier and the combining node, and by the application of a voltage standing wave ratio (VSWR) to the main amplifier using a suitable RF load termination impedance. VSWR is generally speaking a measure of how well a load is matched to the circuit driving it, where standing waves may exist along a transmission path if the impedances are not well matched. Unity VSWR, or a ratio of 1:1, occurs when a load impedance is ideally matched to the driving circuit impedance. Specifically, from the perspective of power amplifier load circuits (including Doherty power amplifiers), the operational VSWR relationship of the load circuit is dependent on the target matching impedance for the power amplifier. If, for example, a given power amplifier's output matching circuit is matched to a target load impedance of 50 Ohms, then the power amplifier will be subject to a 1:1

VSWR if the load circuit is terminated in 50 Ohms and 2:1 VSWR is the load circuit is terminated in 25 Ohms, or 100 Ohms, or any complex impedance on a 2:1 VSWR circle with respect to 50 Ohms. In a Doherty power amplifier where load modulation occurs, the operational VSWRs seen by the main and peaking amplifiers will vary depending on the input power applied to the Doherty amplifier. These operational VSWRs are typically defined at peak power and back-off power for the main amplifier and peak power for the peaking amplifier. The operational VSWRs for the main and peaking amplifiers are defined as the ratio of operational terminating load impedance seen at the output end of the main and peaking output combiner branches to the respective target matching impedances for the main and peaking amplifiers.

Conventionally, Doherty amplifiers are configured to achieve unity VSWR applied to the main and peaking amplifier at full power. Generally, a maximum VSWR is applied to the main amplifier at back-off power levels when the peaking amplifier is turned off (e.g., a VSWR of 2:1). As power of the input signal is increased, the peaking amplifier turns on and begins to load modulate the main amplifier, which reduces the VSWR applied to the main amplifier. Ultimately, at full power, the main amplifier is fully load modulated by the peaking amplifier and the main amplifier sees a unity VSWR loading condition (e.g., a VSWR of 1:1). At back-off power levels, the peaking amplifier is in off state and the peaking amplifier effectively sees "infinite" VSWR. As power of the input signal is increased and the peaking amplifier turns on, the VSWR seen by the peaking amplifier decreases. Ultimately, at full power, the peaking amplifier also sees a unity VSWR loading condition.

In general, there is a direct relationship between VSWR and bandwidth, where lower VSWRs yield greater bandwidth. As a result, the conventional Doherty amplifier has maximum bandwidth at full power and reduced bandwidth at back-off levels. Bandwidth is primarily limited by the VSWR applied at the main amplifier at back-off power levels, where bandwidth decreases as VSWR increases. It is noted for completeness' sake that, at back-off power levels, the peaking amplifier is in off state and therefore is not "directly" impacting bandwidth as such, although the off state loading effect of the peaking amplifier on the main amplifier does have some bearing on bandwidth. Therefore, the primary bandwidth limitation for the conventional Doherty amplifier is the increased VSWR applied at the main amplifier at back-off power. This issue becomes even more pronounced for high efficiency, high power, asymmetric Doherty power amplifiers with a higher peaking power to main power ratio, n. As the peaking to main power ratio n is increased, VSWR also increases, which results in an even greater bandwidth limitation.

Bandwidth limitation of the conventional Doherty amplifier design is typically more of an issue for high power Doherty amplifiers, where bandwidth in both back-off (or low power) region and full power region may be impacted. Bandwidth capability has generally been improved by the implementation of an "inverted" configuration in the Doherty amplifier architecture. In an "inverted" configuration, a 90°/180° output combiner network is implemented, or 90° phase delay is imparted in the main output path and 180° phase delay is imparted in the peaking output path. Conventional Doherty amplifiers often implemented a "non-inverted" configuration having a 270°/180° output combiner network, or 270° phase delay imparted in the main output path and 180° phase delay imparted in the peaking output path. The "inverted" configuration improves bandwidth capability in the back-off region by virtue of the fact that it eliminates 180° electrical length from the main output path.

Examples of known approaches to further improving bandwidth include a modified Doherty output circuit topology that utilizes low power devices, such as gallium nitride (or GaN) devices in a class E implementation, for the main and peaking devices. Such an implementation takes advantage of high native load line impedance of these small, low output power devices to eliminate the customary Doherty output transformer coupled in the RF load circuit. However, such an approach may not work for high output power devices where elimination of the Doherty output transformer may significantly impair RF bandwidth capability over a wide frequency band. Another known approach implements circuit compensation elements such as parallel connected open or short-circuited stubs in the Doherty output combiner network. However, this approach requires additional space to implement the increasing size of the overall output combiner network. In addition, this approach may in some cases result in an undesirable over-compensation of the load modulation characteristic of the main amplifier over an extended bandwidth that may impact wideband linearity and RF performance dispersion characteristics.

The present disclosure provides an inverted, minimum phase 90°/180°, Doherty amplifier architecture suitable for wideband operation (including multi-band operation), whereby the architecture includes output combiner network embodiments that are configured to optimally distribute the voltage standing wave ratio (VSWR) across the back-off (or low) power region and the high power region, which reduces the maximum VSWR applied to the main transmission path at back-off power levels. The output combiner network embodiments also improve bandwidth capability by including options to implement the output transformer, including a single section, multiple section, or other transformer structure. Furthermore, these output combiner network embodiments provide favorable power scaling properties and enable an overall compact and practical design layout.

Doherty Amplifier Operation

Operation of a Doherty amplifier is discussed in connection with FIG. 1, which depicts a two-way Doherty amplifier 100 that includes two amplifying devices arranged in parallel between an input node 102 and an output node 128 of the Doherty amplifier 100. One amplifying device is referred to as a main device 106, and the other amplifying device is referred to as a peaking device 108. The Doherty amplifier 100 also includes a power splitter 110, a phase shifter 112, input matching networks 114 and 116, output matching networks 118 and 120, a delay line 122, an impedance transformer 124, and an RF load connected to the output node 128.

The power splitter 110 is configured to divide an input RF signal supplied at the input node 102, and the divided signals are separately amplified by the main and peaking devices 106 and 108. The amplified signals are then combined in phase at the combining node 104. It is important that phase coherency between the main transmission path (shown as the top transmission path through the main device 106) and the peaking transmission path (shown as the bottom transmission path through the peaking device 108) is maintained across a frequency band of operation to ensure that the amplified main and peaking signals arrive in phase at the combining node 104, and ensure proper Doherty amplifier operation.

It is noted that Doherty amplifier 100 has an "inverted" configuration, where the input signal supplied to the main device 106 is delayed by 90 degrees with respect to the input signal supplied to the peaking device 108 at the center frequency of operation, fo, of the Doherty amplifier 100. As will be discussed further below, the 90 degree differential delay in the input signals between the main and peaking devices 106 and 108 may be imparted by a 90 degree phase delay element 112 coupled to an input of the main device 106. Alternatively, the power divider 110 and the phase delay element 112 may be replaced with a hybrid power splitter 111, which outputs input signals to the main and peaking devices 106 and 108 with the desired 90 degree phase difference.

Each of the main and peaking devices 106 and 108 includes one or more single stage or multiple stage power transistor integrated circuits (ICs) for amplifying an RF signal conducted through the devices 106 and 108. Although the main and peaking power transistor ICs may be of equal size (e.g., in a symmetric Doherty amplifier configuration), the main and peaking power transistor ICs may have unequal sizes as well (e.g., in various asymmetric Doherty amplifier configurations). In an asymmetric Doherty amplifier configuration, the peaking power transistor IC(s) typically are larger than the main power transistor IC(s) by some multiplier. For example, the peaking power transistor IC(s) may be twice the size of the main power transistor IC(s) so that the peaking power transistor IC(s) have twice the current carrying capability of the main power transistor IC(s). Peaking to main amplifier IC size ratios other than a 2:1 ratio may be implemented as well.

Each of the main and peaking devices 106 and 108 may be equal in power capacity (e.g., in a symmetric Doherty amplifier configuration), or may be unequal in power capacity as well (e.g., in various asymmetric Doherty amplifier configurations). In an asymmetric Doherty amplifier configuration, the peaking device 108 has a larger power capacity than the main device 106, providing an output power that is n times larger than the output power of the main device 106, also referred to herein as a power ratio of n:1 (or simply n). The main and peaking devices 106 and 108 can also be modeled as having intrinsic current sources or generators, where the peaking device 108 supplies n times more current than the main device 106. In a symmetrical Doherty amplifier configuration, the main and peaking devices 106 and 108 have a power ratio of 1:1 or n=1. The main and peaking devices 106 and 108 each have a variable output power.

The peaking device 108 is biased to operate in class C mode, where device 108 turns "off" or becomes non-conductive when it receives a radio frequency (RF) signal having an input power below a turn-on threshold level, and turns "on" when it receives an RF signal having an input power above the threshold level (e.g., the transistor arrangement of peaking device 108 is biased to provide a conduction angle less than 180 degrees). This threshold level is also referred to as a "back-off power level," where input power levels below the back-off power level are referred to as being within a "back-off power region" (or may more generally be referred to as "back-off power levels"), and input power levels above the back-off power level are referred to as being within a "high power region." The main device 106 is biased to operate in class AB mode, where device 106 remains "on" or conductive when it receives an RF signal having an input power level in the back-off power region (e.g., the transistor arrangement of main device 106 is biased to provide a conduction angle between 180 and 360 degrees). Since the peaking device 108 is turned off in the back-off power region, the main device 106 is the only amplifier supplying current to the RF load when the power level of the input signal at node 102 is lower than the turn-on threshold level of the peaking device 108, allowing the Doherty amplifier 100 to operate efficiently (e.g., operate with low power consumption) in the back-off power region. Since both the main and peaking devices 106 and 108 are turned on in the high power region, both the main and peaking devices 106 and 108 supply current to the RF load. At this point, the peaking device 108 provides active load modulation at combining node 104, allowing the current of the main device 106 to continue to increase linearly with increasing power at the input signal node 102.

In other words, the main device 106 is the only device providing amplification of RF signals for the Doherty amplifier 100 in the back-off power region, and both the main and peaking devices 106 and 108 provide amplification for RF signals in the high power region up to a peak power level of the Doherty amplifier 100. It is noted that the back-off power level is typically 6 dB below the peak power level of the Doherty amplifier 100 for a symmetrical Doherty amplifier and 9.5 dB for a 2:1 asymmetrical Doherty amplifier. The output power of the Doherty amplifier 100 is at its maximum at the peak power level.

Power splitter 110 is configured to split or divide an input RF signal RFin (such as an RF carrier signal) at node 102 into two portions. During operation, one portion of the input signal is fed to main device 106 on the main transmission path (shown as the top path) and another portion of the input signal is fed to peaking device 108 on the peaking transmission path (shown as the bottom path). The power splitter 110 may divide the power equally, such that roughly one half of the input signal power is provided to each of the main and peaking transmission paths (e.g., for a symmetric Doherty amplifier configuration). Alternatively, the power splitter 110 may divide the power unequally (e.g., for an asymmetric Doherty amplifier configuration).

In some systems, the power splitter 110 may be implemented as a Wilkinson-type divider. At the center frequency of operation, fo, of amplifier 100, a suitable Wilkinson-type divider has the characteristic that it outputs the main and peaking input RF signals with about zero degrees of phase difference between the signals (although the main and peaking signals may lag the input RF signal at input node 102 by about 90 degrees). To ensure that the main and peaking input RF signals arrive at the main and peaking devices 106 and 108 with about 90 degrees of phase difference (which is fundamental for proper operation of the Doherty amplifier), phase shifter 112 is coupled between the power splitter 110 and the input of main device 106 and applies a phase delay to the signal fed to main device 106 of approximately 90 degrees, as compared to the phase of the signal fed to peaking device 108. For example, phase shifter 112 may be a quarter wave transmission line, or another suitable type of delay element with an electrical length of about 90 degrees.

In other systems, power splitter 110 and phase shifter 112 may be replaced with a hybrid power splitter that imparts a 90 degree phase delay to the main input signal, which allows delay shifter 112 to be removed or eliminated from the main transmission path. For example, such a hybrid power splitter may divide an input RF signal into main and peaking input signals with a constant quadrature (90 degrees) phase shift difference versus frequency, resulting in a main input signal having a 90 degree relative phase lag compared to the peaking input signal.

The Doherty amplifier 100 also includes a main input matching network 114 (also referred to as main IMN or IMNm) coupled to the input of the main device 106, and a peaking input matching network 116 (also referred to as peaking IMN or IMNp) coupled to the input of the peaking device 108. The Doherty amplifier 100 also includes a main output matching network 118 (also referred to as main OMN or OMNm) coupled to the output of the main device 106, and a peaking output matching network 120 (also referred to as peaking OMN or OMNp) coupled to the output of the peaking device 108. These matching networks are each configured to match an impedance seen at an input of the respective matching network with an impedance seen at the output of the respective matching network for power transfer. In each case, the matching networks 114, 116, 118, and 120 may be used to incrementally increase the circuit impedance of the main and peaking devices toward the load impedance and source impedance. In addition, each of the main device 106 and the peaking device 108 may have additional input impedance pre-matching networks, output impedance pre-matching networks, or both, that are either integrated within power transistor ICs or dies, or integrated within power transistor die packages.

In order to establish the correct load modulation characteristic in accordance with the operational principles of the "inverted" Doherty amplifier, the main output path is configured to impart a total phase delay of about 90 degrees. The "main output path" extends from an intrinsic current source of the main device 106 to the combining node 104, and includes output matching network OMNm 118 and any output pre-matching network integrated within the main device 106. The main output path can be represented as an equivalent transmission line having a characteristic impedance $Z0m$ shown in FIG. 1. The 90 degree phase delay ensures that the main output path operates as an impedance inverter, where the main output path appears as a voltage source seen from the combining node 104.

Further, a total phase delay of about 180 degrees is imparted on the full peaking output path between the peaking device 108 to the combining node 104. The "full peaking output path" includes a first peaking output path segment and a second peaking output path segment connected in series. The "first peaking output path" extends from an intrinsic current source of the peaking device 108 to the intermediate node 126, and includes output matching network OMNp 120 and any output pre-matching network integrated within the peaking device 108. The first peaking output path can be represented as an equivalent transmission line having a characteristic impedance $Z0p$ shown in FIG. 1. The "second peaking output path" extends from the intermediate node 126 to the combining node 104, and includes delay line 122 between the outputs of the main and peaking devices 106 and 108. The delay line 122 also has a characteristic impedance $Z01$. The 180 degree phase delay ensures that the full peaking output path from the peaking device 106 to the combining node 104 appears as a current source seen at the combining node 104. This is also important to maximize the impedance looking into the full peaking output path from the combining node 104 to minimize undesirable loading of the main transmission path during operation in the back-off power region.

As described above, the main output path is configured to impart a phase delay of about 90 degrees and the full peaking output path is configured to impart a phase delay of about 180 degrees. To ensure that the main and peaking RF signals are combined in phase at combining node 104, the input circuit is configured to have an equal and opposite differential phase characteristic to the differential phase characteristic of the main and peaking output paths. This is accomplished by phase delay element 112 on main input path that provides a phase delay of about 90 degrees to the RF signal on the main input path, which ensures that the RF currents are coherently received at combining node 104.

While the main output path (or the section from the main intrinsic current source to the combining node 104, which includes OMNm 118) must impart a phase delay of about 90 degrees, the similar segment of the peaking output path (or the section from the peaking intrinsic current source to the intermediate node 126, which includes OMNp 120) is not actually required to impart a phase delay of about 90 degrees (although it may do so). Rather, it is the full peaking output path (or the entire section from the peaking intrinsic current source to the combining node 104, which includes both the OMNp 120 and the delay line 122) that is required to impart a phase delay of about 180 degrees. It is noted that FIG. 1 provides an architecture that assumes the first segment of the peaking output path (which includes OMNp 120) implements a phase delay of about 90 degrees (and in turn indicates the second segment of the peaking output path that includes delay line 122 implements a phase delay of about 90 degrees), which simplifies computation of an equivalent characteristic impedance $Z0p$, as depicted in the figure. This simplification is provided in an effort to aid understanding of the underlying operating principles further discussed and illustrated in the present disclosure. This simplification may be regarded as a subset of possible peaking output path phasing relationships in the practical implementation of the inverted Doherty architecture shown in FIG. 1, and is not intended to imply that a practical implementation must be realized in only this manner.

The RF load may also be coupled to the combining node 104 through an impedance transformer 124, which is configured to transform the load impedance of the RF load (e.g., 50 ohms) into a system impedance, R0 divided by VSWR (n+1) seen at the combining node 104 at back-off power levels. The impedance transformer 124 may also be configured to impart a 90 degree phase delay on the RF signal provided to the RF load.

RF power is generated most efficiently when an active device of the Doherty amplifier (e.g., main device 106, or both main device 106 and peaking device 108) delivers RF current into an optimum value of load resistance, which provides the highest power output consistent with the requirement specification for the Doherty amplifier. The optimum value of load resistance (or simply "optimum load resistance") for an active device is determined, in part, by the active device's current transfer characteristics and the active device's class of operation.

As discussed above, a key operational aspect of the Doherty amplifier is the active load modulation of the main device 106 via the peaking device 108. From the back-off power level up to the peak power level, the load seen by the main device 106 is modulated by the peaking device 108 in such a way that the main device 106 operates at its maximum voltage swing. Accordingly, at peak power with both the main and peaking devices 106 and 108 conducting current, maximum efficiency for required output power is achieved when the main device 106 sees an optimum load resistance Ropt. Since the peaking device 108 provides n times more current than the main device 106, the peaking device 108 sees a related load resistance of the optimum load resistance Ropt divided by the power ratio (or Ropt/n) at peak power. In the back-off power region when the peaking device 108 is off and has a load resistance that is ideally infinitely high, the main device 106 is the only device supplying current and sees an increased load resistance of (n+1)·Ropt, which achieves maximum efficiency while satisfying the Doherty load modulation requirement. In other words, the load resistance seen by main device 106 will gradually decrease from (n+1)·Ropt at the back-off power level to Ropt at peak power level. It is noted that the main output path operates as an impedance inverter that transforms the optimum load resistance Ropt seen by the main device 106 at peak power to a greater impedance value of (n+1)·Ropt at back-off power levels.

It is noted that establishing the correct load modulation of the main device 106 in the inverted Doherty amplifier configuration requires: 1) a voltage standing wave ratio (VSWR) applied to the main device 106 using a suitable radio frequency (RF) load termination impedance, and 2) the introduction of at least one impedance inverter connected between the main device 106 and one or more peaking devices 108 in order to ensure that the main device 106 sees a high value load line impedance at back-off power levels to maintain efficient power transfer. The various components coupled to the outputs of the main and peaking devices 106 and 108 may also be referred to herein as an output combiner network. The output combiner network is configured to transform the (real) load impedance of the RF load (e.g., 50 ohms) into the optimum load resistance for the main device 106 and into the related load resistance for the peaking device 108 at peak power. The output combiner network also transforms the load impedance of the RF load into a maximum load resistance for the main device 106 at the back-off power level, which will be modulated by the peaking device 108 as power levels increase up to peak power. In the example shown, the output combiner network includes OMNm 118, OMNp 120, delay line 122, impedance transformer 124, and any output pre-matching network included in main and peaking devices 106 and 108. The main output path may also be referred to as a main branch of the output combiner network, and the full peaking output path may also be referred to as a peaking branch of the output combiner network.

The output combiner network also transforms the load impedance of the RF load into a terminating load impedance seen at the output ends of the main and peaking branches. At peak power, the output end of the main branch sees a system impedance R0. Since the peaking device 108 provides n times more current than the main device 106, the output end of the peaking branch sees a related impedance of the system impedance R0 divided by the power ratio (or R0/n) at peak power. In order to achieve proper load modulation according to Doherty operation principles, the characteristic impedance Z01 of delay line 122 is equivalent to this related impedance of R0/n so that the delay line 122 does not transform impedance at peak power, and instead only changes the phase of the peaking signal. Accordingly, the impedance seen at intermediate node 126 (between the OMNp 120 and delay line 122) at peak power is also R0/n. The required "combined" impedance of the (parallel) main and peaking branches seen at the input end of the impedance transformer 124 at peak power is set to be equivalent to R0/(n+1) by impedance transformer 124. The impedance seen at the output end of the main branch at back-off power levels when the peaking device 108 is off and the main device 106 is the only device supplying current is also set to be equivalent to an impedance of R0/(n+1) by impedance transformer 124.

Accordingly, values can be implemented for remaining equivalent characteristic impedances Z0m of the main output path, Z0p of the first peaking output path, and characteristic impedance ZOO of the impedance transformer 124 to achieve the above described load impedances seen at the main and peaking devices 106 and 108 and at the output ends of the main and peaking branches. It is noted that since the main output path, the first peaking output path (with the above-noted simplification), the delay line 122 (or the second peaking output path, which also reflects the above-noted simplification), and the impedance transformer 124 each implement about 90 degrees phase delay, they may also be viewed as quarter wave transformers. The characteristic impedance of a quarter wave transformer is equivalent to the geometric mean of the load and source impedances connected to the quarter wave transformer, which is expressed as the square root of the product of the load and source impedance values. As shown at the bottom of FIG. 1, the characteristic impedance value for ZOO is the geometric mean of the impedance seen at the input end of transformer 124 and the RF load, or $$\sqrt{50 \cdot R0/(n+1)}.$$

The characteristic impedance value for Z0m is substantially equivalent to the geometric mean of the impedances seen at the main device 106 and at the output of the main branch at peak power, or $$\sqrt{Ropt \cdot R0}.$$

The characteristic impedance value for Z0p is substantially equivalent to the geometric mean of the impedances seen at the peaking device 108 and at the output of the first section of the peaking branch at peak power, or $$\sqrt{Ropt \cdot R0} \cdot (1/n)$$

It is noted that the output matching networks 118 and 120 may each implement complex input and output impedances (having both real and imaginary parts), where the equivalent characteristic impedance values of Z0m and Z0p provided above are determined for the center frequency of operation, fo, of the Doherty amplifier 100. Real-world impedance achieved may vary around these impedance values as the frequency of the input signal varies within the band of operation.

As noted above, a voltage standing wave ratio (VSWR) is applied to the main device 106 in both the full power and back-off power regions. Also, as noted earlier, the operational VSWR of the main device is defined by the ratio of the operational terminating impedance seen at the output end of the main branch to the target matching impedance for the main device. As noted above, the equivalent characteristic impedance Z0m of the main output path (which represents the main output path as an equivalent transmission line) is given as $$\sqrt{Ropt \cdot R0},$$

which shows that the main output path is performing an impedance transformation from the optimum load resistance, Ropt, to the system impedance, R0, seen at the output end of the main branch at peak power. Accordingly, the target matching impedance for the main amplifier is the system impedance, R0. It can also be noted that the target matching impedance for the main device may be conveniently obtained from the expression for the characteristic impedance Z0$m$ by simply replacing Ropt in the expression with R0. That is, Z0$m$ given by $$\sqrt{Ropt \cdot R0}$$

becomes $$\sqrt{R0 \cdot R0}$$

or simply R0. At peak power, the output end of the main branch sees system impedance R0, and hence the VSWR seen by the main device is substantially 1:1. However, at back-off power, the output end of the main branch sees impedance R0/(n+1), resulting in a VSWR of substantially (n+1):1 seen by the main device 106. In an asymmetrical Doherty amplifier configuration as discussed above where n equals 2, the VSWR at back-off power would be 3:1, which unduly limits bandwidth.

Similarly, the operational VSWR of the peaking device is defined by the ratio of the operational terminating impedance seen at the output end of the peaking branch to the target matching impedance for the peaking device. In the case of the conventional Doherty amplifier of FIG. 1, the target matching impedance for the peaking device is R0/$n$, and at peak power the output end of the peaking branch also sees an impedance of R0/$n$. Hence, the VSWR seen by the peaking device at peak power is substantially 1:1.

The present disclosure provides herein various output combiner network embodiments that alleviate the RF bandwidth limitation by reducing the maximum VSWR that the main device 106 is exposed to in the back-off power region. The various embodiments provided herein allow the VSWR values seen in the back-off power region to be traded against the VSWR values seen in the high power region. In some embodiments, the VSWR is evenly distributed in the back-off and high power regions, which reduces the maximum VSWR by a factor of $$\sqrt{(n+1)}.$$

This represents the optimum trade-off between the back-off and high power regions. Other matching methodologies are also used herein, such as an indirect matching technique used for matching impedances on the peaking path, which is especially beneficial for high efficiency, high power, asymmetric Doherty amplifiers with a higher peak to main device power ratio n.

The present disclosure also provides minimum phase Doherty output network solutions that eliminate 180 degree electrical length from the main transmission path, thereby providing enhancement of RF bandwidth capability and reduced circuit losses. Further, the present disclosure does not exclude a single, common output transformer arrangement, thereby maintaining full flexibility for choice of system impedance. It is noted that excluding a single, common output transformer arrangement can dramatically impair RF bandwidth capability, depending on the output power rating (or optimum load-line impedance) of the intended application. While the present disclosure focuses primarily on high efficiency, asymmetric Doherty power amplifiers with a peaking to main device power ratio greater than 1, the present disclosure does not exclude a symmetric scenario where the power ratio equals 1. It is also noted that the present disclosure does not implement open or short-circuited stubs, which require additional space to implement and increases the size of the overall output combiner network. In this manner, a practical design layout is maintained by using a solution with a single-section or a multi-section wideband output transformer. However, it is noted that a single-section output transformer may be beneficial for minimizing the size of the output combiner network and for minimizing circuit losses.

The present disclosure is also especially beneficial for high power Doherty amplifiers (e.g., up to 100 W or more average power and up to 1000 W or more peak power), but may also be used in architectures that use low power amplifiers (e.g., on the order of 10 W average power and 100 W peak power) in other embodiments. While the examples provided herein implement an inverted topology for the Doherty amplifier architecture, a non-inverted topology for the Doherty amplifier architecture may be used in other embodiments, where the main and peaking path VSWR relationships computed for an inverted 90°/180° Doherty architecture (as described herein) are also applicable for an otherwise identical non-inverted 270°/180° Doherty architecture. However, the inverted Doherty architecture provides a bandwidth advantage over the non-inverted Doherty architecture since an equivalent 180° of electrical length has been removed from the main output path.

Doherty Amplifier with Output Combiner Network Embodiments

Figure 2:
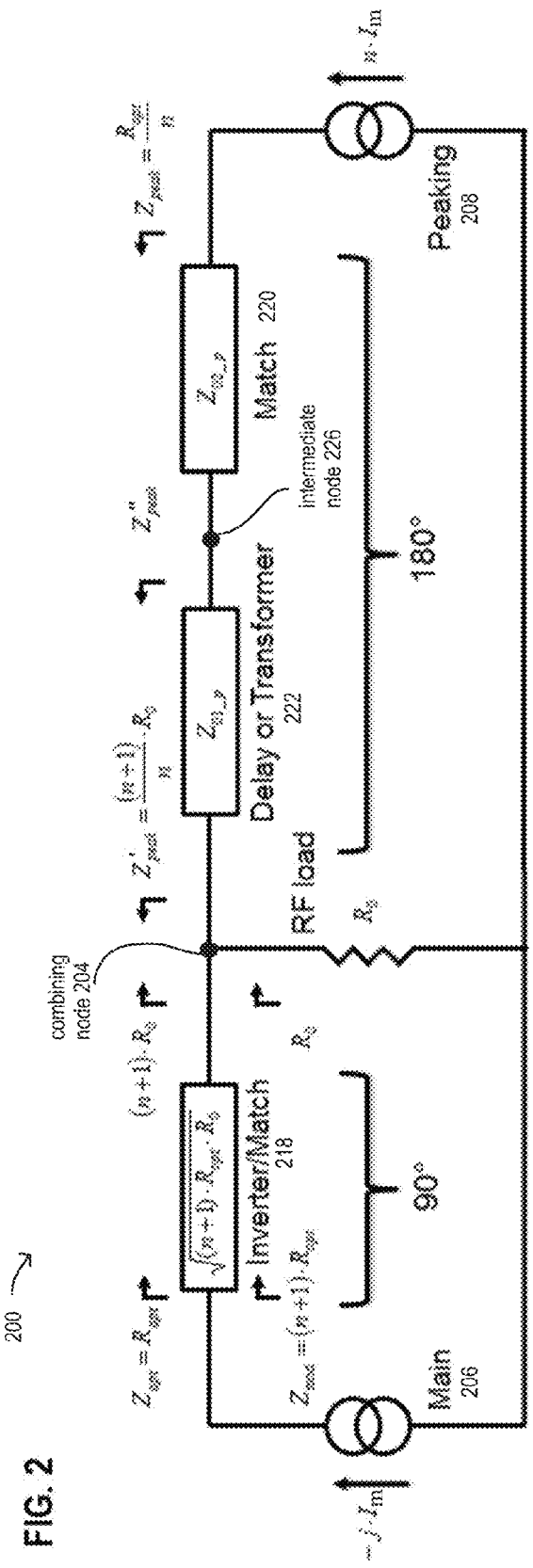
FIG. 2 illustrates a block diagram of an example ideal generalized form of a Doherty amplifier device output circuit in which the present disclosure is implemented, according to some embodiments.

FIG. 2 illustrates a block diagram of an example generalized or simplified form of a Doherty amplifier device 200 in which the presently disclosed output combiner network is implemented. The Doherty amplifier device 200 includes a main device and a peaking device similar to main device 106 and peaking device 108 discussed above. In the embodiments discussed herein, the Doherty amplifier device 200 implements an asymmetric Doherty arrangement where the peaking device provides an output power that is n times larger than the output power of the main device, also referred to as the power ratio n. A symmetric Doherty arrangement may be utilized in other embodiments.

Figure 10:
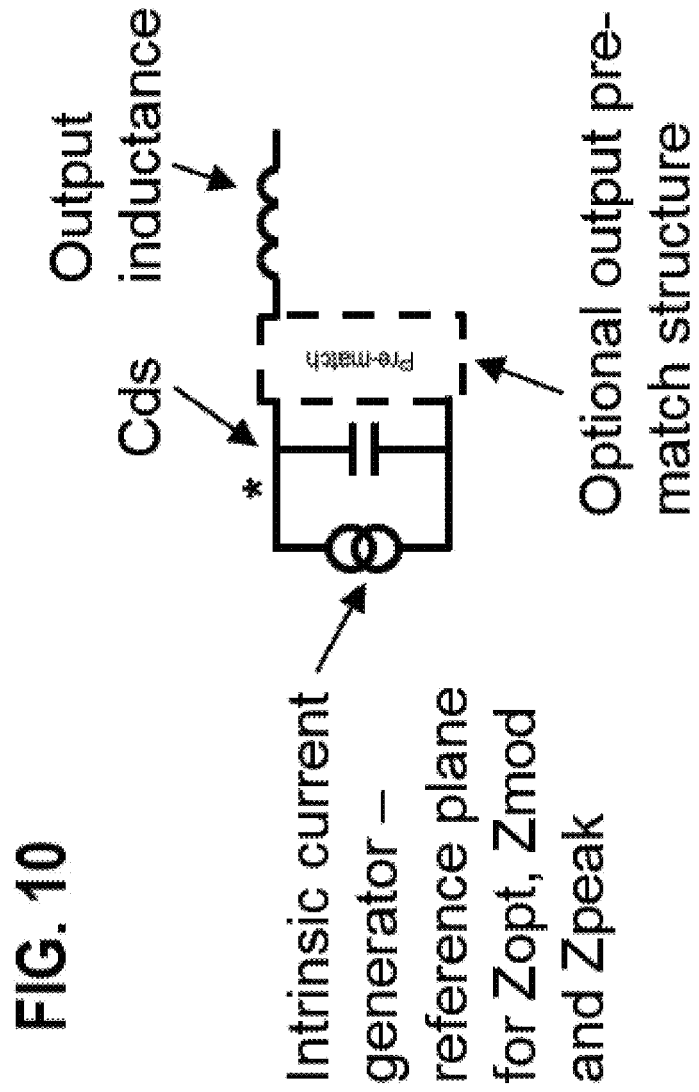
FIG. 10 illustrates a block diagram depicting an internal output circuit of an example amplifier used in the Doherty amplifier devices discussed herein, according to some embodiments.

An output circuit model of a power amplifier device like that used to implement the main and peaking devices is shown in FIG. 10. The power amplifier device may be implemented using one or more single stage or multiple stage power transistor integrated circuits (ICs) as part of a transistor die or within a power transistor package. A power amplifier device increases the power of an input signal by taking power from a power supply and controlling the output to match the input signal shape, but with a larger amplitude.

Essentially, the output of the power amplifier device may be modeled as a current source or generator with a drain-source capacitance (labeled as Cds). An optional output impedance pre-matching network (labeled as Pre-match within a dashed box) and a series output inductance may also be integrated within the main or peaking device (such as within the transistor die or power transistor package). The series output inductance may include any parasitic inductance of the transistor that implements the power amplifier device, bond wires or interconnects to output lead of a power transistor package, and the optional output pre-matching network may be used to tune the impedance of the power amplifier device. For simplicity's sake, an asterisk is used to represent the components of the drain-source capacitance Cds, the optional output pre-matching network, and the series output inductance, where the output circuit model of FIG. 10 is represented within each main and peaking device in FIG. 3-5 and FIG. 7-9 by a current generator and an asterisk located at the output of the current generator. The current generator also serves as a reference plane for measuring output path impedance and phase delay, as further discussed below.

Returning to FIG. 2, the generalized form of the Doherty amplifier device 200 shows a main current generator 206 that outputs main current Im and a peaking current generator 208 that outputs a peaking current Ip that is equivalent to n·Im. Main current generator 206 is coupled to a combining node 204 through a main output path, and peaking current generator 208 is coupled to combining node 204 through a full peaking output path. Combining node 204 is coupled to an RF load network represented as system impedance R0.

Figure 3:
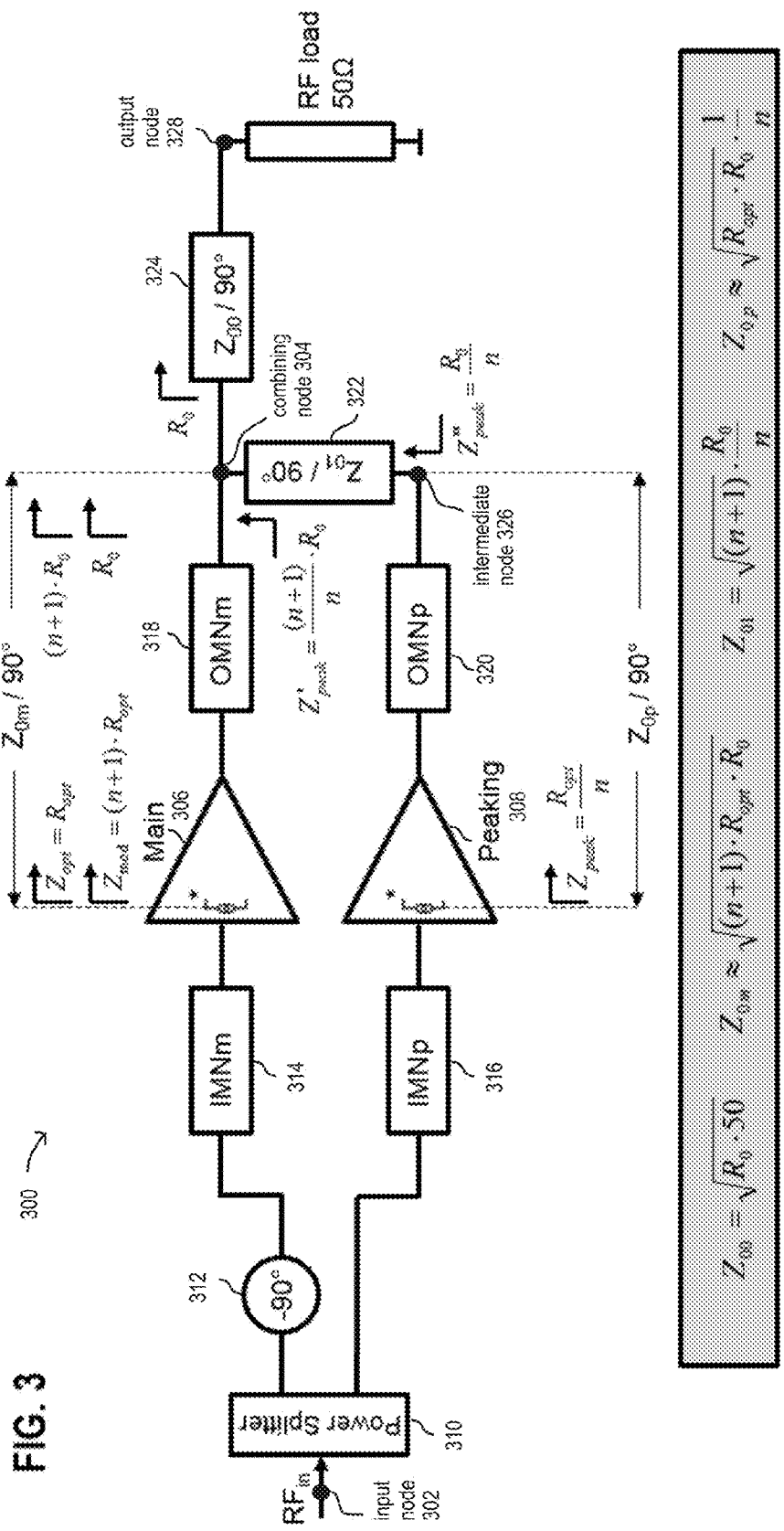
FIG. 3, FIG. 4, and FIG. 5 illustrate block diagrams depicting example implementations of the Doherty amplifier device of FIG. 2, according to some embodiments.
Figure 4:
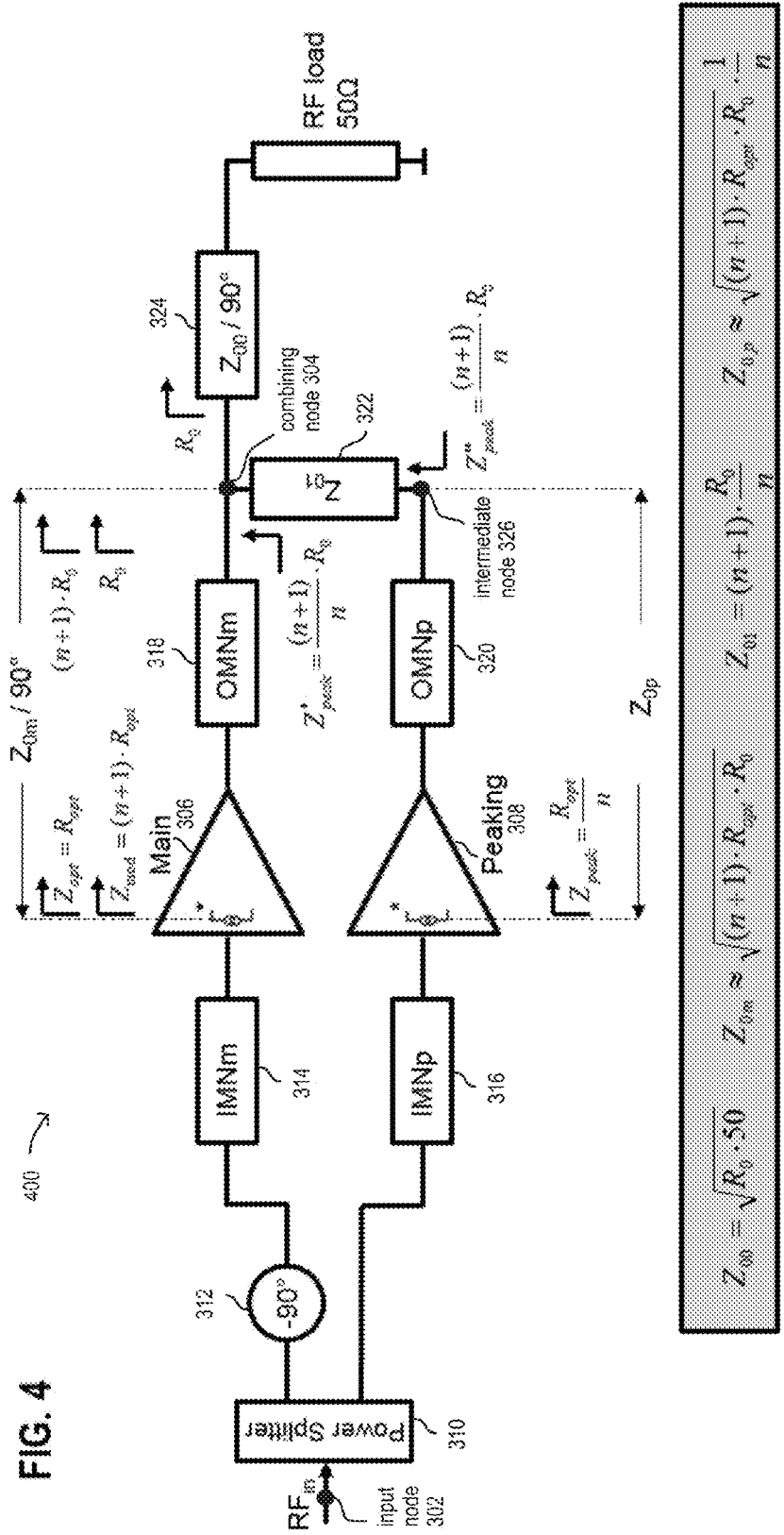
Figure 5:
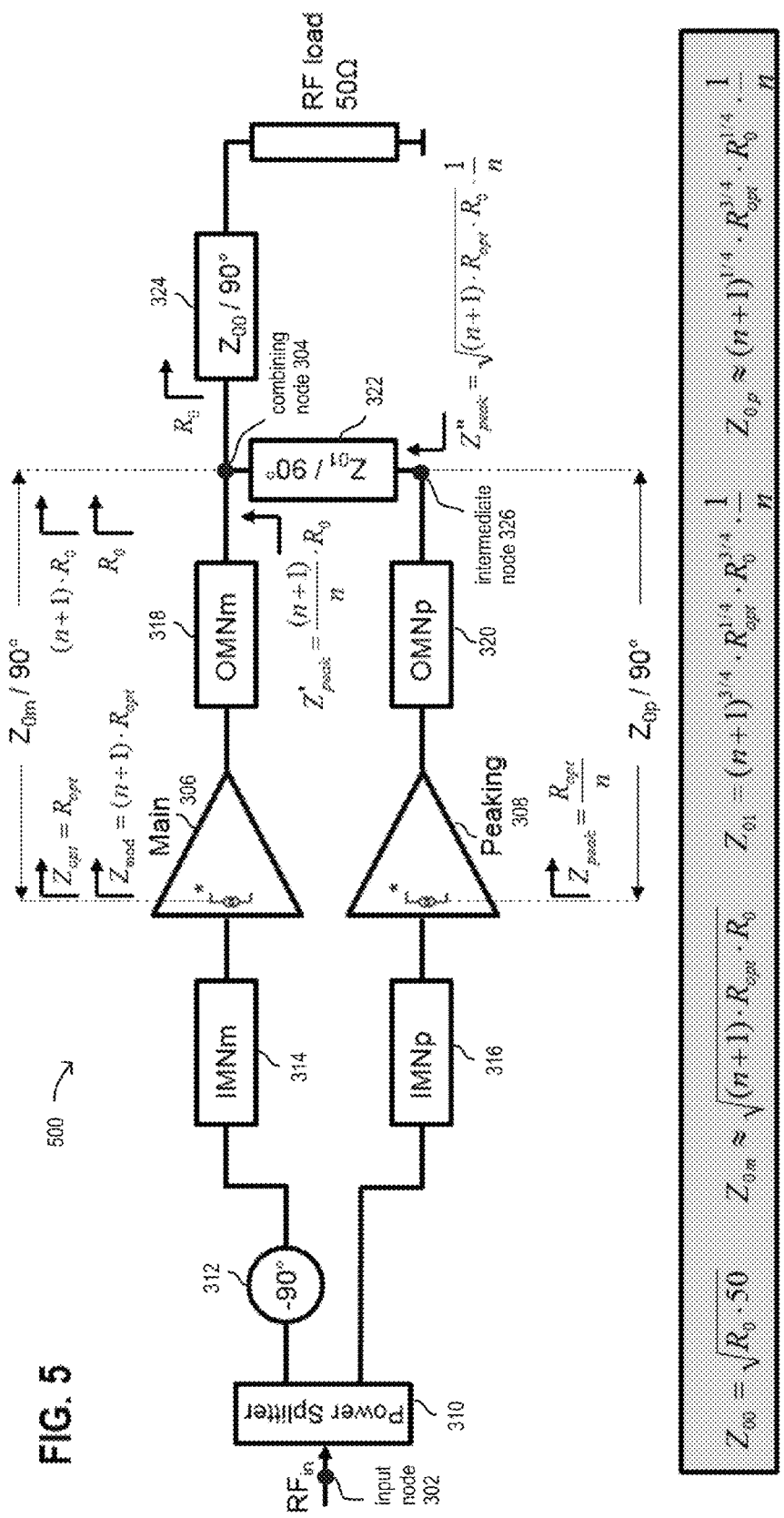

The main output path from the reference plane of the main current generator 206 to the combining node 204 can be represented or modeled as an equivalent transmission line 218 having a characteristic impedance Z0m, which includes the impedance implemented by the drain-source capacitor, any optional output pre-matching network, and series output inductance that are implemented within the main device (as shown in FIG. 10), as well as an output matching network present between the main device and the combining node 204 (as shown in FIG. 3-5). The main output path transmission line 218 is also labeled as Inverter/Match 218, indicating that the main output path is configured to act as an impedance inverter.

The full peaking output path from the reference plane of the peaking current generator 208 to the combining node 204 can be represented or modeled as two transmission lines 220 and 222 connected in series. Transmission line 220 represents a first peaking output path segment from the peaking current generator 208 to intermediate node 226, which includes the impedance implemented by the drain-source capacitor, any optional output pre-matching network, and series output inductance that are implemented within the peaking device (as shown in FIG. 10), as well as an output matching network present between the peaking device and an intermediate node 226 (as shown in FIG. 3-5).

Transmission line 222 represents a second peaking output path segment from the intermediate node 226 to the combining node 204. Transmission line 222 is labeled as Delay or Transformer 222, which indicates that transmission line 222 implements either an impedance transformation (such as an impedance inverter that transforms impedance in the high power region) or a phase delay (such as an impedance inverter that is terminated in its own characteristic impedance, which does not transform impedance at peak power).

It is noted that the Doherty amplifier device 200 implements an inverted configuration. The main output path transmission line 218 is configured to implement a 90 degree phase delay between the main current generator 206 and the combining node 204, and the full peaking output path (or combined first and second peaking output path segments) implements a 180 degree phase delay between the peaking current generator 208 and the combining node 204. The input signal supplied to the main device is delayed by about 90 degrees with respect to the input signal supplied to the peaking device at the center frequency of operation, fo, of the Doherty amplifier 200 in order to provide an equal and opposite differential phase characteristic with respect to the main output path and full peaking output path to ensure phase coherency of the main and peaking signals at combining node 204. It is noted that each of the peaking output path transmission lines 220 and 222 are not limited to only providing 90 degree phase delay, where the transmission lines 220 and 222 may each implement a different phase delay that amounts to a total phase delay of 180 degrees. In this manner, a minimum phase solution is provided for 90 degree/180 degree output combiner network embodiments for an inverted Doherty amplifier architecture.

As noted above, RF power is generated most efficiently for a given output requirement when the (active) devices of the Doherty amplifier 200 deliver current into an optimum value of load resistance. Maximum efficiency for a given output power requirement is achieved at peak power when the optimum load impedance seen at the output of the main current generator 206, also referred to as Zopt, is equal to an optimum (real) load impedance (or optimum load resistance) Ropt. Since the peaking current generator 208 provides n times more current than the main current generator 206, the output of the peaking current generator 208 sees a related load impedance of the optimum load resistance Ropt divided by the power ratio (or Ropt/n) at peak power, also referred to as Zpeak. In the back-off power region when the peaking current generator 208 is off and has a load resistance that is ideally infinitely high, the main current generator 206 is the only device supplying current and sees an increased load impedance of (n+1)·Ropt, also referred to as Zmod, which achieves maximum efficiency while satisfying the Doherty load modulation requirement. It is noted that the load impedances Zopt and Zmod are measured from the reference plane of the main current generator 206, and Zpeak is measured from the reference plane of the peaking current generator 208. It is also noted that the convention of labeling impedances seen at peak power above the impedances seen at back-off power is continued through the drawings.

The presently disclosed output combiner network is represented by transmission lines 218, 220, and 222, which is configured to transform the load impedance of the RF load network into Zopt and Zpeak for the main and peaking devices at peak power, and to transform the load impedance of the RF load network into Zmod for the main device at back-off power, which will be modulated by the peaking device as power levels increase up to peak power. The main output path may also be referred to as a main branch of the presently disclosed output combiner network, and the full peaking output path may also be referred to as a peaking branch of the presently disclosed output combiner network.

The presently disclosed output combiner network is also configured to transform the load impedance of the RF load network into a terminating load impedance seen at the output ends of the main and peaking branches. To achieve a distributed VSWR seen by the main output path (discussed below), the RF load network connected to the combining node 204 is defined as having a system impedance R0, which is the terminating load impedance seen at the output end of the main branch at back-off power (instead of defining system impedance R0 as the terminating load impedance seen at peak power). At peak power, the output end of the main branch sees an impedance greater by a factor of (n+1), in order to satisfy the Doherty load modulation requirement, or (n+1)·R0. Since the peaking current generator 208 provides n times more current than the main current generator 206 at peak power, the output end of the peaking branch sees a related impedance of (n+1)·R0/n, also referred to as Z'peak. The load impedance Z"peak seen at intermediate node 226 depends on the function of transmission line 222, which may implement a phase delay or an impedance transformation, as further discussed below.

The characteristic impedance $Z0m$ of the (equivalent) main output path transmission line 218 between the main current generator 206 and the combining node 204 is implemented as the geometric mean of the optimum load impedance Zopt seen at the output of the main current generator 206 at peak power and the load termination impedance $(n+1)\cdot R0$ seen at the output end of the main output path at peak power, resulting in $Z0m$ equivalent to $$\sqrt{(n+1)\cdot Ropt\cdot R0},$$

which shows that the main output path is performing an impedance transformation from the impedance seen at the main current generator reference plane and the impedance seen at the output end of the main output path. It is noted that $Z0m$ is also equivalent to the geometric mean of the impedance Zmod and the load termination impedance $R0$ at back-off power, in order to satisfy the Doherty load modulation requirement. As used herein, the "geometric mean" refers to multiplying two impedance values (such as the impedance values of the load impedance seen at an output of the active device's current generator reference plane and the load termination impedance seen at the output end of the active device's output path), and then taking the square root of the resulting product.

As noted above, the operational VSWR (voltage standing wave ratio) seen by the main device is defined by the ratio of the operational terminating load impedance seen at the output end of the main branch to the target matching impedance for the main device. As also noted above, the target matching impedance for the main device may be conveniently obtained from the expression for the characteristic impedance $Z0m$ of the main branch by replacing Ropt with $R0$ in the expression for $Z0m$. In FIG. 2, $Z0m$ is given by $$\sqrt{(n+1)\cdot Ropt\cdot R0}$$

and becomes $$\sqrt{(n+1)\cdot R0\cdot R0}$$

when Ropt is replaced with $R0$, which simplifies to $$\sqrt{(n+1)}\cdot R0.$$

At peak power, output end of the main branch sees $(n+1)\cdot R0$, and the target matching impedance is $$\sqrt{(n+1)}\cdot R0,$$

resulting in a VSWR of $$\sqrt{(n+1)}:1$$

seen by the main device at full power. At back-off power, the output end of the main branch sees R0, also resulting in a VSWR of $$\sqrt{(n+1)}:1$$

seen by the main device at back-off power.

Put another way, the target matching impedance for the main device in this example may be described as equivalent to the geometric mean of the load termination impedance seen at the output end of the main output path at peak power and the load termination impedance seen at the output end of the main output path at back-off power, such as $$\sqrt{(n+1)}\cdot R0$$

for the embodiments shown in FIGS. 3, 4, and 5. It is noted that $R0$ may be replaced with Ropt in all the circuit element equations herein, including the RF load network. When the presently disclosed output combiner network implements the impedances defined above, the main output path sees a VSWR equivalent to $$\sqrt{(n+1)}:1$$

at both peak power and back-off power, which trades off a unity VSWR at peak power for increased bandwidth at back-off power.

Similarly, the peaking output path will see an operational VSWR that is defined by the ratio of the operational impedance seen at the output end of the peaking output path and the target matching impedance for the peaking device, depending on the practical implementation, as further discussed below.

It is noted that there are several methodologies for performing impedance matching on the peaking output path, where impedance Z"peak at the intermediate node 226 may be the same as Z'peak seen at the output end of the peaking output path or may be different than Z'peak. In some embodiments, impedance matching on the peaking output path may be performed using an indirect matching technique where transmission line 222 is configured to perform an impedance transformation at intermediate node 226 (as further discussed below in connection with FIG. 3). In other embodiments, a direct matching technique is used, where transmission line 222 is configured to implement a delay line that does not perform an impedance transformation at intermediate node 226 (as further discussed below in connection with FIG. 4). In still other embodiments, a binomial matching technique is used, where the characteristic impedance Z01 of transmission line 222 and the characteristic impedance $Z0p$ of the equivalent peaking output path transmission line 220 are arranged according to the relationships for a binomial transformer that is maximally flat (as further discussed below in connection with FIG. 5). However, other methodologies for performing impedance matching on the peaking output path may also be used in other embodiments.

In embodiments where both first and second segments are performing an impedance transformation, the full peaking output path may be seen as a dual section impedance matching network. It is also noted that different approaches for computing the target matching impedance for the peaking device are possible. For example, the target matching impedance may be computed by considering the total impedance transformation performed by both segments of the peaking output path. Alternatively, the target matching impedance may be computed as being set to the characteristic impedance Z01 of the delay/transformer element 222. With regard to operational VSWR computation, these different approaches to computing target matching impedance will result in different VSWRs. The latter method is chosen in this disclosure to best highlight the operational differentiation among the various embodiments and when compared to the conventional Doherty architecture of FIG. 1. Accordingly, for the embodiments discussed herein, the target matching impedance for the peaking device is given by the expression of the characteristic impedance Z01 of the delay line/transformer 222, also referred to as the peaking device being matched to Z01. The operational VSWR seen by the peaking output path (or by the peaking device) is defined by the ratio of the operational impedance seen at the output end of the peaking path at full power to the target matching impedance for the peaking device.

FIG. 3 illustrates an example practical implementation of the generalized form of a Doherty amplifier device shown in FIG. 2, using an indirect matching technique for performing impedance matching on the peaking output path. It is noted that the components shown in FIG. 3 have analogous counterparts in FIG. 4-5 and FIG. 7-9, although the analogous counterparts may be implemented in such a way to achieve different impedance matching in the main and peaking output paths, as further discussed below.

The Doherty amplifier device 300 includes a main device 306 and a peaking device 308 placed in parallel between an input node 302 and combining node 304. An asymmetrical Doherty amplifier structure is discussed in the embodiments herein, where the output power of the peaking device 308 is n times larger than the output power of the main device 306, n being larger than one (e.g., peaking device has a larger power capability than the main device, where the peaking device is larger than the main device), although a symmetric Doherty amplifier structure may be implemented in other embodiments where n is equal to one (e.g., main and peaking device have a same power capability and may be an equal size).

The Doherty amplifier device 300 also includes a main input matching network 314 (also referred to as main IMN or IMNm) coupled to the input of the main device 306, and a peaking input matching network 316 (also referred to as peaking IMN or IMNp) coupled to the input of the peaking device 308. The Doherty amplifier device 300 also includes a main output matching network 318 (also referred to as main OMN or OMNm 318) coupled to the output of the main device 306, and a peaking output matching network 320 (also referred to as peaking OMN or OMNp 320) coupled to the output of the peaking device 308. In each case, the matching networks 314, 316, 318, and 320 may be used to incrementally increase the circuit impedance of the main and peaking devices toward the load impedance and source impedance.

As noted above, main and peaking devices 306 and 308 can be modeled as the output circuit model of FIG. 10, which is represented within main device 306 and peaking device 308 by a current generator and an asterisk. The main current generator serves as a reference plane for measuring main output path impedance and phase, and the peaking current generator serves as a reference plane for measuring peaking output path impedance and phase. The main current generator outputs a main current Im and the peaking current generator outputs a peaking current Ip that is equivalent to n·Im.

The main output path from the main current generator plane to the combining node 304 can be represented or modeled as an equivalent main output path transmission line having a characteristic impedance $Z0m$. Characteristic impedance $Z0m$ includes the impedance implemented by the intrinsic components of the output circuit model and the OMNm 318.

Similarly, a first peaking output path segment from the peaking current generator plane to intermediate node 326 can be represented or modeled as an equivalent peaking output path transmission line having a characteristic impedance $Z0p$. Characteristic impedance $Z0p$ includes the impedance implemented by the intrinsic components of the output circuit model and the OMNp 320. A second peaking output path segment from intermediate node 326 to combining node 304 includes delay line/transformer 322, which has a characteristic impedance Z01. The first and second peaking output path segments form a full peaking output path. The impedance transformer 324 is connected between the combining node 304 and the output node 328, which has a characteristic impedance ZOO.

It is noted that Doherty amplifier device 300 implements an inverted configuration, where the main output path (from the main current generator to combining node 304) is configured to implement a 90 degree phase delay, and the full peaking output path (from the peaking current generator to combining node 304) implements a 180 degree phase delay. The full peaking output path includes delay line/transformer 322 to ensure the full peaking output path implements 180 degree phase delay. In the embodiment shown, delay line/transformer 322 provides about 90 degrees phase delay (between the intermediate node 326 and the combining node 304), and the first segment of the peaking output path implements a phase delay of about 90 degrees between the peaking current generator and intermediate node 326. For the particular embodiment of FIG. 3 (indirect match), the first and second segments of the peaking output path are configured to each impart a 90 degree phase delay because delay line/transformer 322 having characteristic impedance Z01 performs an impedance transformation.

The Doherty amplifier device 300 also includes a power splitter 310 that splits an input RF signal RFin (such as an RF carrier signal) at node 302 into two portions before being fed to main and peaking devices 306 and 308. In order to ensure phase coherency of the main and peaking signals at combining node 304, the input signal supplied to the main device is delayed by about 90 degrees by a phase shifter 312 to provide an equal and opposite differential phase characteristic with respect to the main output path and full peaking output path. As noted above, power splitter 310 and phase shifter 312 may be replaced by a hybrid power splitter.

The combining node 304 is coupled to an RF load network that includes an output impedance transformer 324 and an RF load of 50 ohms. Output impedance transformer 324 may be implemented by a single section, multiple section, or other transformer structure. In the embodiment shown, a single section transformer 324 having a 90 degree phase delay is used. It is noted that a single section output transformer 324 represents a preferred embodiment due to being compact and minimizing circuit losses.

The main current generator also serves as a reference plane for optimum load impedance Zopt at peak power and for Zmod at back-off power, where Zopt and Zmod are seen at the output of the main current generator. The peaking current generator serves as a reference plane for related load impedance Zpeak at peak power, which is seen at the output of the peaking current generator.

As noted above, the presently disclosed output combiner network is configured to transform the load impedance of the RF load network into Zopt and Zpeak for the main and peaking devices 306 and 308 at peak power, and into Zmod for the main device 306 at back-off power. The presently disclosed output combiner network is also configured to transform the load impedance of the RF load network into system impedance R0 seen at the combining node 304. The modeled version of the output combiner network shown in FIG. 2 can be translated into the practical implementation of the output combiner network shown in FIG. 3, which includes OMNm 318, OMNp 320, delay line/transformer 322, and impedance transformer 324. The components of the output combiner network are configured to take into account any impedance introduced by the intrinsic output circuit model components of the main and peaking devices 306 and 308, such that the characteristic impedances Z0m of the main output path and Z0p of the first peaking output path segment are achieved as described below. It is noted that the values of such impedances Z0m and Z0p are determined for the center frequency of operation, fo, of the Doherty amplifier device 300. The real-world impedance achieved may vary around these impedance values as the frequency of the input signal varies within the band of operation. It is also noted that the expressions for Z0m and Z0p are shown with an equivalency sign (rather than an equal sign) in order to show that these expressions are representative of an "equivalent" characteristic impedance if the respective output path (main or peaking) were entirely replaced by a single, equivalent transmission line that performs same matching function at center frequency, fo (e.g., replacing Cds, any output pre-matching network, output inductance, and OMN of the respective output path).

For maximum efficiency for a given output power requirement, the main device 306 sees optimum load impedance Zopt (at the output of the main current generator) at peak power, which is equal to an optimum load resistance Ropt. In the back-off power region when the peaking device 308 is off and the main device 306 is the only active device supplying current, the main device 306 sees a load impedance Zmod (at the output of the peaking current generator) that is greater than the optimum load impedance by a factor of (n+1), or (n+1)·Ropt. As described above in connection with FIG. 2, a VSWR of $$\sqrt{(n+1)} : 1$$

is achieved on the main output path at both peak power and back-off power by defining a system impedance R0 as the terminating load impedance seen at the output end of the main output path at back-off power. At peak power, the output end of the main output path sees a load impedance that is greater than the system impedance by a factor of (n+1), or (n+1)·R0, to satisfy the Doherty load modulation requirement. In order to provide a load termination impedance of R0 at the combining node 304, the characteristic impedance ZOO of output impedance transformer 324 is configured to be equivalent to the geometric mean of R0 and the RF load resistance (or 50 ohms), which is equivalent to $$\sqrt{R0 \cdot 50}.$$

The characteristic impedance Z0m of the main output path is configured to be the geometric mean of the load impedance seen at the main current generator and the load impedance seen at the output of the main output path at either peak power or at back-off power, which is equivalent to $$\sqrt{(n+1) \cdot Ropt \cdot R0}.$$

Similarly, the peaking device 308 sees related load impedance Zpeak (at the output of the peaking current generator) at peak power, which is equal to the optimum load resistance Ropt divided by n, or Ropt/n, since the peaking current generator provides n times more current than the main current generator at peak power. The output end of the full peaking output path (or at the output of delay line/transformer 322) sees a related impedance of (n+1)·R0/n at peak power, also referred to as Z'peak.

An indirect matching technique is used for impedance matching on the full peaking output path, where an intermediate impedance transformation occurs at intermediate node 326. In this embodiment, delay line/transformer 322 may be characterized as an impedance transformer 322. The intermediate impedance seen at intermediate node 326 is referred to as Z"peak. In this embodiment, transformer 322 implements an impedance inversion similar to that implemented by the main output path, where the impedance Z'peak seen at the output end of the transformer 322 is greater than the impedance Z"peak seen at the input end of the transformer 322 by a factor of (n+1). In this manner, an impedance value of R0/n is implemented as Z"peak, and the characteristic impedance Z01 of transformer 322 is equivalent to the geometric mean of Z'peak and Z"peak, which is equivalent to $$\sqrt{(n+1)} \cdot R0/n.$$

The characteristic impedance Z0p is implemented as the geometric mean of the related load impedance Zpeak seen at the peaking current generator at peak power and the intermediate impedance Z"peak seen at intermediate node 326, which is equivalent to $$\sqrt{Ropt \cdot R0} \cdot 1/n.$$

In other words, the peaking device 308 is (indirectly) matched to a target impedance equivalent to the characteristic impedance Z01, or $$\sqrt{(n+1)} \cdot R0/n.$$

According to the implemented impedances, the peaking output path also sees a VSWR equivalent to $$\sqrt{(n+1)} : 1$$

at peak power.

Put another way, the indirect matching technique for the peaking path involves distributing the match for the full peaking path over both first and second path segments, where both the first and second peaking path segments act as impedance transformers. By contrast, a direct matching technique implies that only the first peaking path segment performs impedance transformation, while the second peaking path segment only acts as a delay line, as further discussed below in connection with FIG. 4.

FIG. 4 illustrates another example practical implementation of the generalized form of the Doherty amplifier device shown in FIG. 2, using a direct matching technique for performing impedance matching on the peaking output path. The Doherty amplifier device 400 includes the analogous components and inverted configuration discussed above in connection with FIG. 3. The matching conditions for the main output path are implemented for FIG. 4 in the manner as discussed above in connection with FIGS. 2 and 3, which achieves a VSWR seen by the main output path equivalent to $$\sqrt{(n+1)} : 1$$

at both peak power and back-off power.

At peak power, the peaking device 308 sees the related load impedance Zpeak (at the output of the peaking current generator), which is equivalent to Ropt/n, and the output end of the full peaking output path (at the output of delay line/transformer 322) sees the related load impedance Z'peak, which is equivalent to $(n+1) \cdot R0/n$.

A direct matching technique is used for impedance matching on the full peaking output path, where no impedance transformation occurs at intermediate node 326. In this embodiment, delay line/transformer 322 may be characterized as purely a delay line 322. In the embodiment shown, an intermediate impedance Z"peak at intermediate node 326 is implemented as being equivalent to Z'peak seen at the output of the delay line 322, or $(n+1) \cdot R0/n$. Delay line 322 may be configured to act as a delay line when terminated by its own characteristic impedance. Accordingly, the characteristic impedance Z01 of delay line 322 is implemented as also being equivalent to Z'peak, or $(n+1) \cdot R0/n$.

The characteristic impedance Z0p is implemented as the geometric mean of the related load impedance Zpeak seen at the peaking current generator at peak power and the intermediate impedance Z"peak seen at intermediate node 326, which is equivalent to $$\sqrt{(n+1) \cdot Ropt \cdot R0} \cdot 1/n.$$

In other words, the peaking device is (directly) matched to a target impedance equivalent to Z'peak, or $(n+1) \cdot R0/n$. According to the implemented impedances, the peaking output path sees a VSWR equivalent to 1:1 at peak power.

Again, it is noted that, in the practical implementation shown in FIG. 4, delay line/transformer 322 is assumed to provide about 90 degrees phase delay (between the intermediate node 326 and the combining node 304), and the first segment of the peaking output path similarly implements a phase delay of about 90 degrees between the peaking current generator and intermediate node 326, which simplifies the computation for Z0p. However, delay line/transformer 322 and the first segment of the peaking output path (represented by Z0p) are not limited to each providing about 90 degree phase delay, but rather that the entire peaking output path (including both delay line/transformer 322 and the first segment of the peaking output path, which in turn includes Cds, any output pre-match network, output inductance, and OMN) should add up to 180 degree phase delay, which may be implemented in other embodiments of the present disclosure.

FIG. 5 illustrates another example practical implementation of the generalized form of the Doherty amplifier device shown in FIG. 2, using a binomial matching technique for performing impedance matching on the peaking output path. The Doherty amplifier device 500 includes the analogous components and inverted configuration discussed above in connection with FIG. 3. The matching conditions for the main output path are implemented for FIG. 5 in the manner as discussed above in connection with FIGS. 2, 3, and 4, which achieves a VSWR seen by the main output path equivalent to $$\sqrt{(n+1)} : 1$$

at both peak power and back-off power. It is noted that the first and second segments of the full peaking output path (respectively shown as having characteristic impedances Z0p and Z01) for the practical implementation of FIG. 5 each implement 90 degree phase delay since delay line/transformer 322 having characteristic impedance Z01 performs an impedance transformation.

At peak power, the peaking device 308 sees the related load impedance Zpeak (at the output of the peaking current generator), which is equivalent to Ropt/n, and the output end of the full peaking output path (at the output of delay line/transformer 322) sees the related load impedance Z'peak, which is equivalent to $(n+1) \cdot R0/n$.

A binomial matching technique is used for impedance matching on the full peaking output path. In this embodiment, delay line/transformer 322 may be characterized as an impedance transformer 322. This technique may also be considered a variation of an indirect matching technique since both the first and second peaking path segments act as impedance transformers. In the embodiment shown, an intermediate impedance Z"peak at intermediate node 326 is implemented as being equivalent to the geometric mean of Zpeak and Z'peak, or $$\sqrt{(n+1) \cdot Ropt \cdot R0} \cdot 1/n.$$

The characteristic impedance Z01 of impedance transformer 322 is implemented as being equivalent to the geometric mean of Z'peak and Z"peak, which is equivalent to $$(n+1)^{3/4} \cdot Ropt^{1/4} \cdot R0^{3/4} \cdot 1/n.$$

The characteristic impedance Z0p is implemented as the geometric mean of the related load impedance Zpeak seen at the peaking current generator plane at peak power and the intermediate impedance Z"peak at intermediate node 326, which is equivalent to $$(n+1)^{1/4} \cdot Ropt^{3/4} \cdot R0^{1/4} \cdot 1/n.$$

In other words, the peaking device is (indirectly) matched to a target impedance equivalent of the characteristic impedance Z01, or $$(n+1)^{3/4} \cdot Ropt^{1/4} \cdot R0^{3/4} \cdot 1/n.$$

According to the implemented impedances, the peaking path sees a VSWR equivalent to $$(n+1)^{1/4} \cdot Ropt^{-1/4} \cdot R0^{1/4} : 1.$$

at peak power. It is noted that in the case of when Ropt is set to R0 or R0 is set to Ropt, this simplifies to a VSWR of $$(n+1)^{1/4} : 1$$

at peak power.

Figure 6:
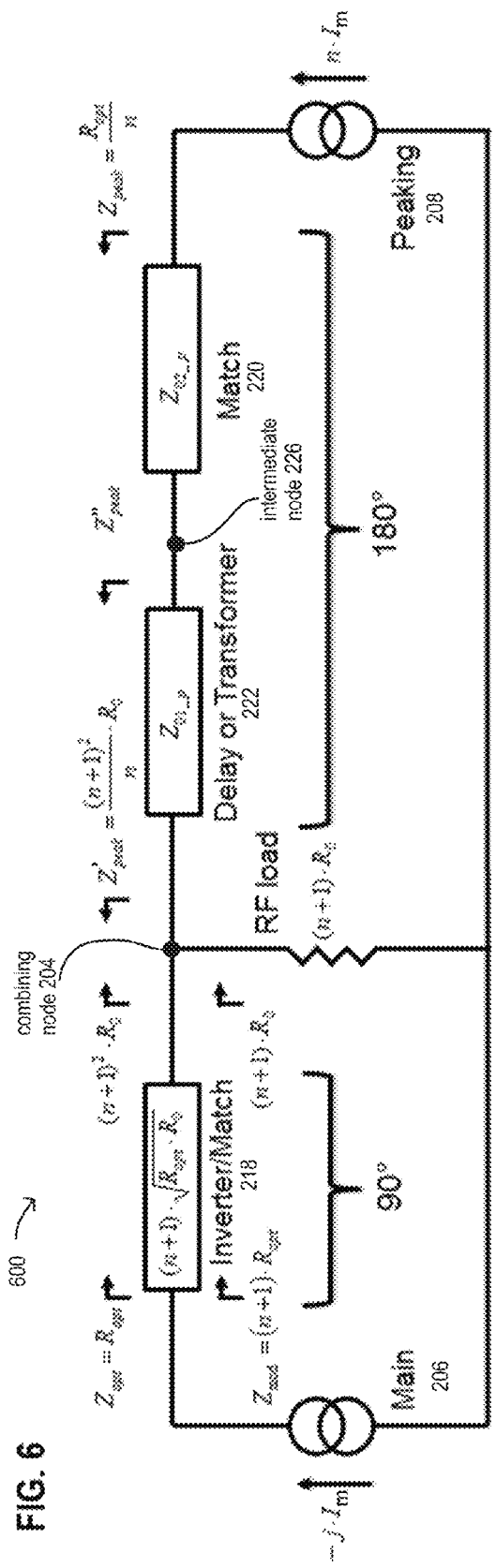
FIG. 6 illustrates a block diagram of another example ideal generalized form of a Doherty amplifier device output circuit in which the present disclosure is implemented, according to some embodiments.

FIG. 6 illustrates a block diagram of another example generalized form of a Doherty amplifier device 600 in which the present disclosure is implemented. The Doherty amplifier device 600 includes the analogous components discussed above in connection with FIG. 2, such as a main current generator 206 and a peaking current generator 208 that are coupled to an RF load network. In the embodiments discussed herein, the Doherty amplifier device 600 implements an asymmetric Doherty arrangement where the peaking device provides an output power that is n times larger than the output power of the main device, also referred to as the power ratio n. A symmetric Doherty arrangement may be utilized in other embodiments.

Figure 7:
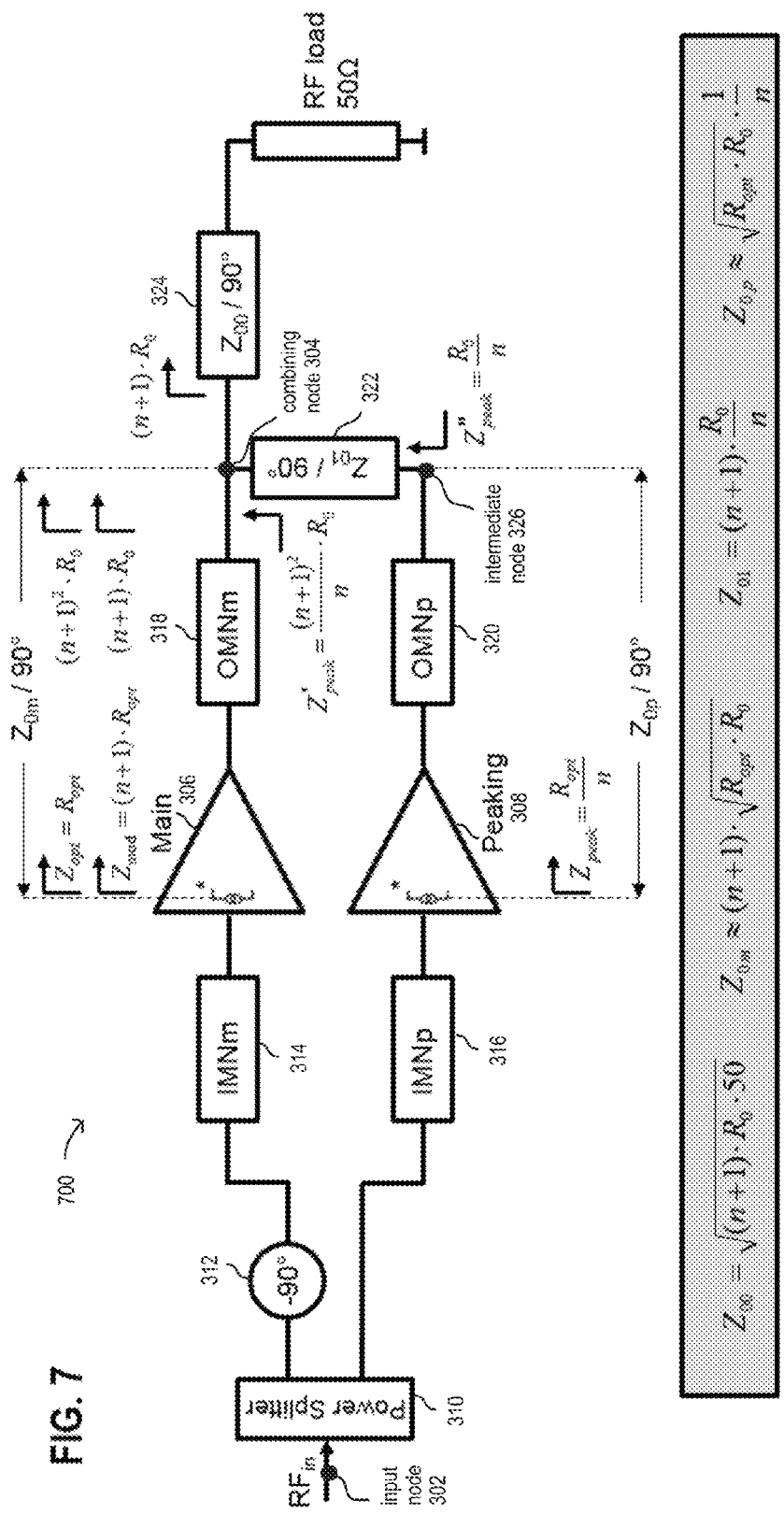
FIG. 7, FIG. 8, and FIG. 9 illustrate block diagrams depicting example implementations of the Doherty amplifier device of FIG. 6, according to some embodiments.
Figure 8:
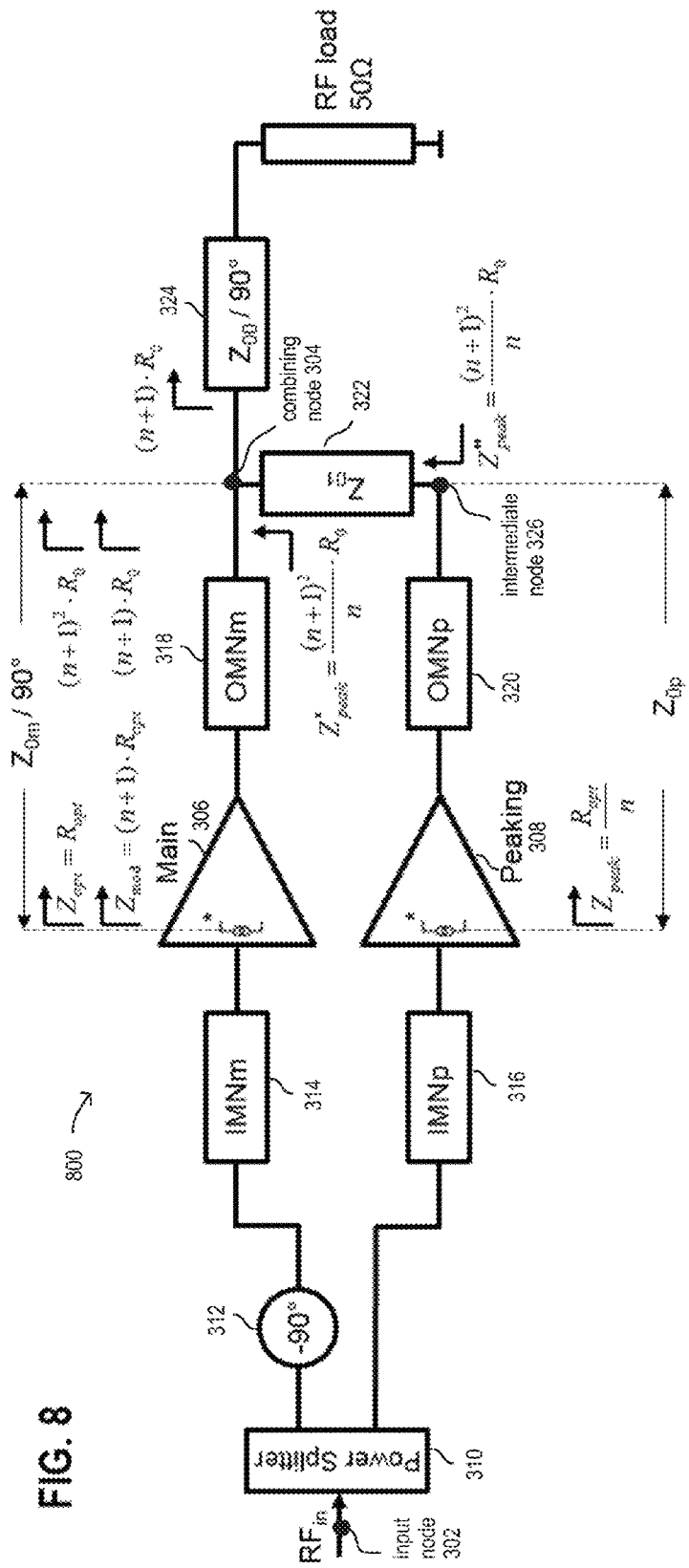
Figure 9:
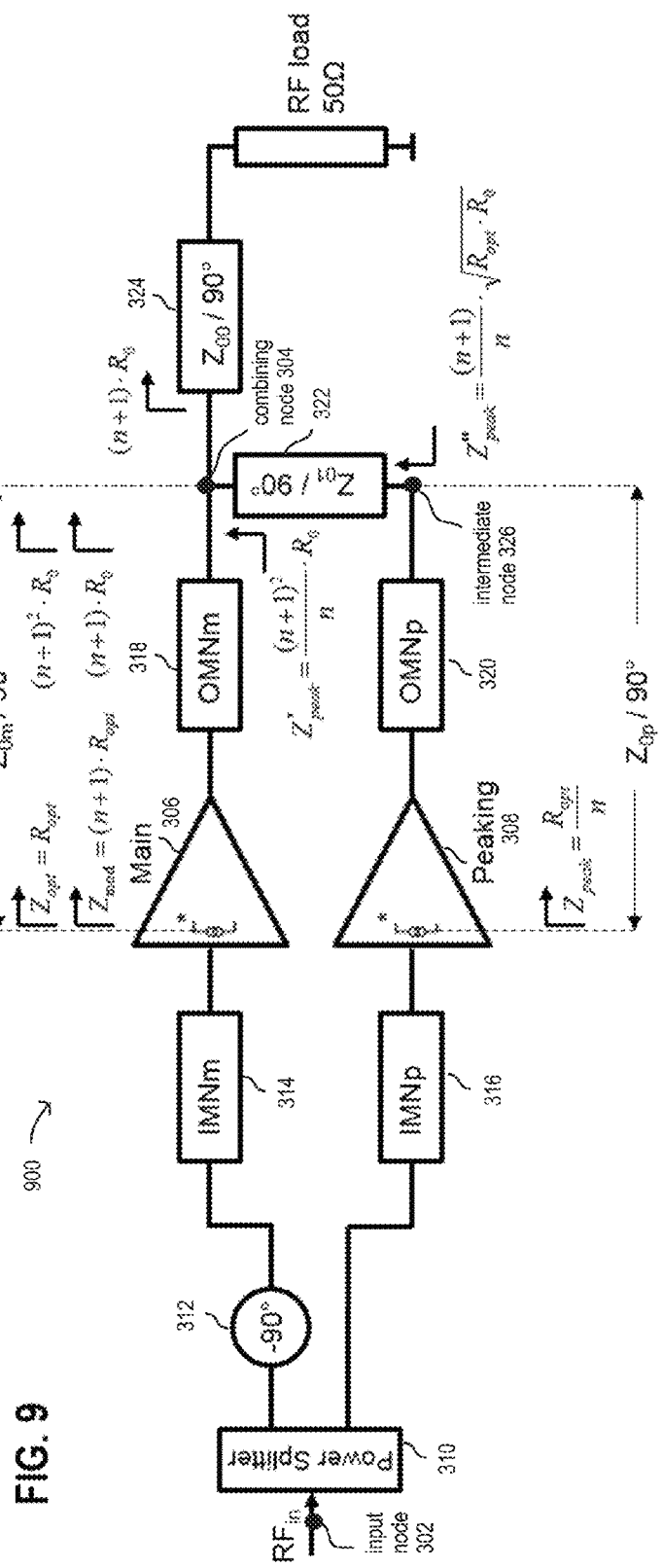

The main output path from the reference plane of the main current generator 206 to the combining node 204 can be represented or modeled as an equivalent transmission line 218 having a characteristic impedance Z0m, which includes the impedance implemented by the drain-source capacitor, any optional output pre-matching network, and series output inductance that are implemented within the main device (as shown in FIG. 10), as well as an output matching network present between the main device and the combining node 204 (as shown in FIG. 7-9). The main output path transmission line 218 is also labeled as Inverter/Match 218, indicating that the main output path is configured to act as an impedance inverter.

The full peaking output path from the reference plane of the peaking current generator 208 to the combining node 204 can be represented or modeled as two transmission lines 220 and 222 connected in series. Transmission line 220 represents a first peaking output path segment from the peaking current generator 208 to intermediate node 226, which includes the impedance implemented by the drain-source capacitor, any optional output pre-matching network, and series output inductance that are implemented within the peaking device (as shown in FIG. 10), as well as an output matching network present between the peaking device and an intermediate node 226 (as shown in FIG. 7-9).

Transmission line 222 represents a second peaking output path segment from the intermediate node 226 to the combining node 204. Transmission line 222 is labeled as Delay or Transformer 222, which indicates that transmission line 222 implements either an impedance transformation (such as an impedance inverter that transforms impedance in the high power region) or a phase delay (such as an impedance inverter that is terminated in its own characteristic impedance, which does not transform impedance at peak power).

It is noted that the Doherty amplifier device 600 implements an inverted configuration. The main output path transmission line 218 is configured to implement a 90 degree phase delay between the main current generator 206 and the combining node 204, and the full peaking output path (or combined first and second peaking output path segments) implements a 180 degree phase delay between the peaking current generator 208 and the combining node 204. The input signal supplied to the main device is delayed by 90 degrees with respect to the input signal supplied to the peaking device at the center frequency of operation, fo, of the Doherty amplifier device 600 in order to provide an equal and opposite differential phase characteristic with respect to the main output path and full peaking output path to ensure phase coherency of the main and peaking signals at combining node 204. It is noted that each of the peaking output path transmission lines 220 and 222 are not limited to only providing 90 degree phase delay, where the transmission lines 220 and 222 may each implement a different phase delay that amounts to a total phase delay of 180 degrees. In this manner, a minimum phase solution is provided for 90 degree/180 degree output combiner network embodiments for an inverted Doherty amplifier architecture.

Maximum efficiency for a given output power requirement is achieved at peak power when the optimum load impedance Zopt seen at the output of the main current generator 206 is equal to an optimum load resistance Ropt. Since the peaking current generator 208 provides n times more current than the main current generator 206, the output of the peaking current generator 208 sees a related load impedance Zpeak equivalent to the optimum load resistance Ropt divided by the power ratio (or Ropt/n) at peak power. In the back-off power region when the peaking current generator 208 is off and has a load resistance that is ideally infinitely high, the main current generator 206 is the only device supplying current and sees an increased load impedance Zmod of (n+1)·Ropt, which achieves maximum efficiency while satisfying the Doherty load modulation requirement.

The presently disclosed output combiner network is represented by transmission lines 218, 220, and 222, which is configured to transform the load impedance of the RF load network into Zopt and Zpeak for the main and peaking devices at peak power, and to transform the load impedance of the RF load network into Zmod for the main device at back-off power, which will be modulated by the peaking device as power levels increase up to peak power. The presently disclosed output combiner network is also configured to transform the load impedance of the RF load network into a terminating load impedance seen at the output ends of the main and peaking output paths.

In this embodiment, the RF load network connected to the combining node 204 is defined as having an adjusted system impedance equivalent to system impedance R0 multiplied by a factor of (n+1), or (n+1)·R0, which is the terminating load impedance seen at the output end of the main output path at back-off power. At peak power, the output end of the main output path sees a load impedance that is greater than the impedance seen at back-off power by a factor of (n+1), or $(n+1)^2 \cdot R0$, to satisfy the Doherty load modulation requirement. Since the peaking current generator 208 provides n times more current than the main current generator 206 at peak power, the output end of the peaking branch sees a related impedance of $(n+1)^2 \cdot R0/n$, also referred to as Z'peak. The load impedance Z"peak seen at intermediate node 226 depends on the function of transmission line 222, which may implement a phase delay or an impedance transformation, as further discussed below.

The characteristic impedance Z0m of the (equivalent) main output path transmission line 218 between the main current generator 206 and the combining node 204 is implemented as the geometric mean of the optimum load impedance Zopt seen at the output of the main current generator 206 at peak power and the load termination impedance $(n+1)^2 \cdot R0$ seen at the output end of the main output path at peak power, resulting in Z0m equivalent to $$(n+1) \cdot \sqrt{Ropt \cdot R0}.$$

It is noted that Z0m is also equal to the geometric mean of the impedance Zmod and the load termination impedance R0 at back-off power, in order to satisfy the Doherty load modulation requirement. As used herein, the "geometric mean" refers to multiplying two impedance values (such as the impedance values of the load impedance seen at an output of the active device's current generator reference plane and the load termination impedance seen at the output end of the active device's output path), and then taking the square root of the resulting product.

As noted above, the operational VSWR seen by the main device is defined by the ratio of the operational terminating load impedance seen at the output end of the main branch to the target matching impedance for the main device. As also noted above, the target matching impedance for the main device may be conveniently obtained from the expression for the characteristic impedance Z0m of the main branch by replacing Ropt with R0. In FIG. 6, Z0m is given by $$(n+1) \cdot \sqrt{Ropt \cdot R0}$$

and becomes $$(n+1) \cdot \sqrt{R0 \cdot R0}$$

when Ropt is replaced with R0, which simplifies to $(n+1) \cdot R0$. At peak power, the output end of the main branch sees $(n+1)^2 \cdot R0$, and the target matching impedance is $(n+1) \cdot R0$, resulting in a VSWR of $(n+1):1$ seen by the main branch at full power. At back-off power, the output end of the main branch sees $(n+1) \cdot R0$, resulting in a VSWR of 1:1 seen by the main branch at back-off power.

Similarly, the peaking output path will see an operational VSWR that is defined by the ratio of the operational impedance seen at the output end of the peaking output path and the target matching impedance for the peaking device, depending on the practical implementation, as further discussed below.

It is noted that there are several methodologies for performing impedance matching on the peaking output path, where impedance Z"peak at the intermediate node 226 may be the same as Z'peak seen at the output end of the peaking output path or may be different than Z'peak. For example, impedance matching on the peaking output path may be performed using an indirect matching technique where transmission line 222 is configured to perform an impedance transformation at intermediate node 226 (as further discussed below in connection with FIG. 7), a direct matching technique where transmission line 222 is configured to implement a delay line that does not perform an impedance transformation at intermediate node 226 (as further discussed below in connection with FIG. 8), and a binomial matching technique where the characteristic impedance Z01 of transmission line 222 and the characteristic impedance Z0p of the equivalent peaking output path transmission line 220 are arranged according to the relationships for a binomial transformer that is maximally flat (as further discussed below in connection with FIG. 9). However, other methodologies for performing impedance matching on the peaking output path may also be used in other embodiments.

For the reasons provided above with respect to FIG. 2, the target matching impedance for the peaking device in the embodiments herein is similarly given by the expression of the characteristic impedance Z01 of the delay line 222, also referred to as the peaking device being matched to Z01. Operational VSWR seen by the peaking output path is given by the ratio of the operational impedance seen at the output end of the peaking path at full power to the target matching impedance for the peaking device.

FIG. 7 illustrates an example practical implementation of the generalized form of the Doherty amplifier device shown in FIG. 6, using an indirect matching technique for performing impedance matching on the peaking path. The Doherty amplifier device 700 includes the analogous components and the inverted configuration discussed above in connection with FIG. 3.

As noted above, the presently disclosed output combiner network is configured to transform the load impedance of the RF load network into Zopt and Zpeak for the main and peaking devices 306 and 308 at peak power, and into Zmod for the main device 306 at back-off power. The presently disclosed output combiner network is also configured to transform the load impedance of the RF load network into adjusted impedance $(n+1) \cdot R0$ seen at the combining node 304. The modeled version of the output combiner network shown in FIG. 6 can be translated into the practical implementation of the output combiner network shown in FIG. 7, which includes OMNm 318, OMNp 320, delay line/transformer 322, and impedance transformer 324. The components of the output combiner network are configured to take into account any impedance introduced by the intrinsic output circuit model components of the main and peaking devices 306 and 308, such that the characteristic impedances Z0m of the main output path and Z0p of the first peaking output path segment are achieved as described below. It is noted that the values of such impedances Z0m and Z0p are determined for the center frequency of operation, fo, of the Doherty amplifier device 300. The real-world impedance achieved may vary around these impedance values as the frequency of the input signal varies within the band of operation. It is also noted that the expressions for Z0m and Z0p are shown with an equivalency sign (rather than an equal sign) in order to show that these expressions are representative of an "equivalent" characteristic impedance if the respective output path (main or peaking) were entirely replaced by a single, equivalent transmission line that performs same matching function at center frequency, fo (e.g., replacing Cds, any output pre-matching network, output inductance, and OMN of the respective output path).

For maximum efficiency for a given output power requirement, the main device 306 sees optimum load impedance Zopt (at the output of the main current generator) at peak power, which is equal to an optimum load resistance Ropt. In the back-off power region when the peaking device 308 is off and the main device 306 is the only active device supplying current, the main device 306 sees a load impedance Zmod (at the output of the peaking current generator) that is greater than the optimum load impedance by a factor of (n+1), or (n+1)·Ropt. As described above in connection with FIG. 6, a VSWR of (n+1):1 is seen by the main output path at peak power and a VSWR of 1:1 is seen by the main output path at back-off power by defining an adjusted system impedance (n+1)·R0 as the terminating load impedance seen at the output end of the main output path at back-off power. At peak power, the output end of the main output path sees a load impedance that is greater than the adjusted system impedance by a factor of (n+1), or $(n+1)^2$·R0, to satisfy the Doherty load modulation requirement. In order to provide a load termination impedance of (n+1)·R0 at the combining node 304, the characteristic impedance ZOO of output impedance transformer 324 is configured to be equivalent to the geometric mean of (n+1)·R0 and the RF load resistance (or 50 ohms), which is equivalent to $$\sqrt{(n+1) \cdot R0 \cdot 50}.$$

The characteristic impedance Z0m of the main output path is configured to be the geometric mean of the load impedance seen at the main current generator and the load impedance seen at the output of the main output path, which is equivalent to $$(n+1) \cdot \sqrt{Ropt \cdot R0}$$

at both peak power and back-off power.

Similarly, the peaking device 308 sees related load impedance Zpeak (at the output of the peaking current generator) at peak power, which is equal to the optimum load resistance Ropt divided by n, or Ropt/n, since the peaking current generator provides n times more current than the main current generator at peak power. The output end of the full peaking output path (or at the output of delay line/transformer 322) sees a related impedance of $(n+1)^2$·R0/n at peak power, also referred to as Z'peak.

An indirect matching technique is used for impedance matching on the full peaking output path, where an intermediate impedance transformation occurs at intermediate node 326. The intermediate impedance seen at intermediate node 326 is referred to as Z"peak, where delay line/transformer 322 may also be characterized as an impedance transformer 322. In this embodiment, transformer 322 implements an impedance inversion similar to that implemented by the main output path at peak power, where the impedance Z'peak seen at the output end of the transformer 322 is greater than the impedance Z"peak seen at the input end of the transformer 322 by a factor of $(n+1)^2$. In this manner, an impedance value of R0/n is implemented as Z"peak, and the characteristic impedance Z01 of transformer 322 is equivalent to the geometric mean of Z'peak and Z"peak, which is equivalent to (n+1)·R0/n.

The characteristic impedance Z0p is implemented as the geometric mean of the related load impedance Zpeak seen at the peaking current generator at peak power and the intermediate impedance Z"peak at intermediate node 326, which is equivalent to $$\sqrt{Ropt \cdot R0} \cdot 1/n.$$

In other words, the peaking device is (indirectly) matched to a target impedance equivalent to the characteristic impedance Z01, or (n+1)·R0/n. According to the implemented impedances, the peaking output path sees a VSWR equivalent to (n+1):1 at peak power.

FIG. 8 illustrates another example practical implementation of the generalized form of the Doherty amplifier device shown in FIG. 6, using a direct matching technique for performing impedance matching on the peaking path. The Doherty amplifier device 800 includes the analogous components and inverted configuration discussed above in connection with FIG. 3. The matching conditions for the main output path are implemented for FIG. 8 in the manner as discussed above in connection with FIGS. 6 and 7, which achieves a VSWR seen by the main output path equivalent to (n+1):1 at peak power and a VSWR seen by the main output path equivalent to 1:1 at back-off power.

At peak power, the peaking device 308 sees the related load impedance Zpeak (at the output of the peaking current generator), which is equivalent to Ropt/n, and the output end of the full peaking output path (at the output of delay line/transformer 322) sees the related load impedance Z'peak, which is equivalent to $(n+1)^2$·R0/n.

A direct matching technique is used for impedance matching on the full peaking output path, where no impedance transformation occurs at intermediate node 326. In this embodiment, delay line/transformer 322 may be characterized as a delay line 322. In the embodiment shown, an intermediate impedance Z"peak at intermediate node 326 is implemented as being equivalent to Z'peak seen at the output of the delay line 322, or $(n+1)^2$·R0/n. Delay line 322 may be configured to act as a delay line when terminated by its own characteristic impedance. Accordingly, the characteristic impedance Z01 of delay line 322 is implemented as also being equivalent to Z'peak, or $(n+1)^2$·R0/n.

The characteristic impedance Z0p is implemented as the geometric mean of the related load impedance Zpeak seen at the peaking current generator at peak power and the intermediate impedance Z"peak seen at intermediate node 326, which is equivalent to $$\sqrt{Ropt \cdot R0} \cdot (n+1)/n.$$

In other words, the peaking device is (directly) matched to a target impedance equivalent to Z'peak, or $(n+1)^2$·R0/n. According to the implemented impedances, the peaking output path sees a VSWR equivalent to 1:1 at peak power.

Again, it is noted that, in the practical implementation shown in FIG. 8, delay line/transformer 322 is assumed to provide about 90 degrees phase delay (between the intermediate node 326 and the combining node 304), and the first segment of the peaking output path similarly implements a phase delay of about 90 degrees between the peaking current generator and intermediate node 326, which simplifies the computation for Z0p. However, delay line/transformer 322 and the first segment of the peaking output path (represented by Z0p) are not limited to each providing about 90 degree phase delay, but rather that the entire peaking output path (including both delay line/transformer 322 and the first segment of the peaking output path, which in turn includes Cds, any output pre-match network, output inductance, and OMN) should add up to 180 degree phase delay, which may be implemented in other embodiments of the present disclosure.

FIG. 9 illustrates another example practical implementation of the generalized form of the Doherty amplifier device shown in FIG. 6, using a binomial matching technique for performing impedance matching on the peaking output path. The Doherty amplifier device 900 includes the analogous components and inverted configuration discussed above in connection with FIG. 3. The matching conditions for the main output path are implemented for FIG. 9 in the manner as discussed above in connection with FIGS. 6 and 7, which achieves a VSWR seen by the main output path equivalent to (n+1):1 at peak power and a VSWR seen by the main output path equivalent to 1:1 at back-off power. It is noted that the first and second segments of the full peaking output path (respectively shown as having characteristic impedances Z0p and Z01) for the practical implementation of FIG. 9 each implement 90 degree phase delay since delay line/transformer 322 having characteristic impedance Z01 performs an impedance transformation.

At peak power, the peaking device 308 sees the related load impedance Zpeak (at the output of the peaking current generator), which is equivalent to Ropt/n, and the output end of the full peaking output path (at the output of delay line/transformer 322) sees the related load impedance Z'peak, which is equivalent to $(n+1)^2 R0/n$.

A binomial matching technique is used for impedance matching on the full peaking output path. In this embodiment, delay line/transformer 322 may be characterized as an impedance transformer 322. This technique may also be considered a variation of an indirect matching technique since both the first and second peaking path segments act as impedance transformers. In the embodiment shown, an intermediate impedance Z"peak at intermediate node 326 is implemented as being equivalent to the geometric mean of Zpeak and Z'peak, or $$\sqrt{Ropt \cdot R0} \cdot (n+1)/n.$$

The characteristic impedance Z01 of impedance transformer 322 is implemented as being equivalent to the geometric mean of Z'peak and Z"peak, which is equivalent to $$(n+1)^{3/2} \cdot Ropt^{1/4} \cdot R0^{3/4} \cdot 1/n.$$

The characteristic impedance Z0p is implemented as the geometric mean of the related load impedance Zpeak seen at the peaking current generator plane at peak power and the intermediate impedance Z"peak at intermediate node 326, which is equivalent to $$(n+1)^{1/2} \cdot Ropt^{3/4} \cdot R0^{1/4} \cdot 1/n.$$

In other words, the peaking device is (indirectly) matched to a target impedance equivalent of the characteristic impedance Z01, or $$(n+1)^{3/2} \cdot Ropt^{1/4} \cdot R0^{3/4} \cdot 1/n.$$

According to the implemented impedances, the peaking output path sees a VSWR equivalent to $$(n+1)^{1/2} \cdot Ropt^{-1/4} \cdot R0^{1/4} : 1$$

at peak power. It is noted that in the case of when Ropt is set to R0 or R0 is set to Ropt, this simplifies to a VSWR of $$(n+1)^{1/2} : 1$$

at peak power.

Figures 11A, 11B:
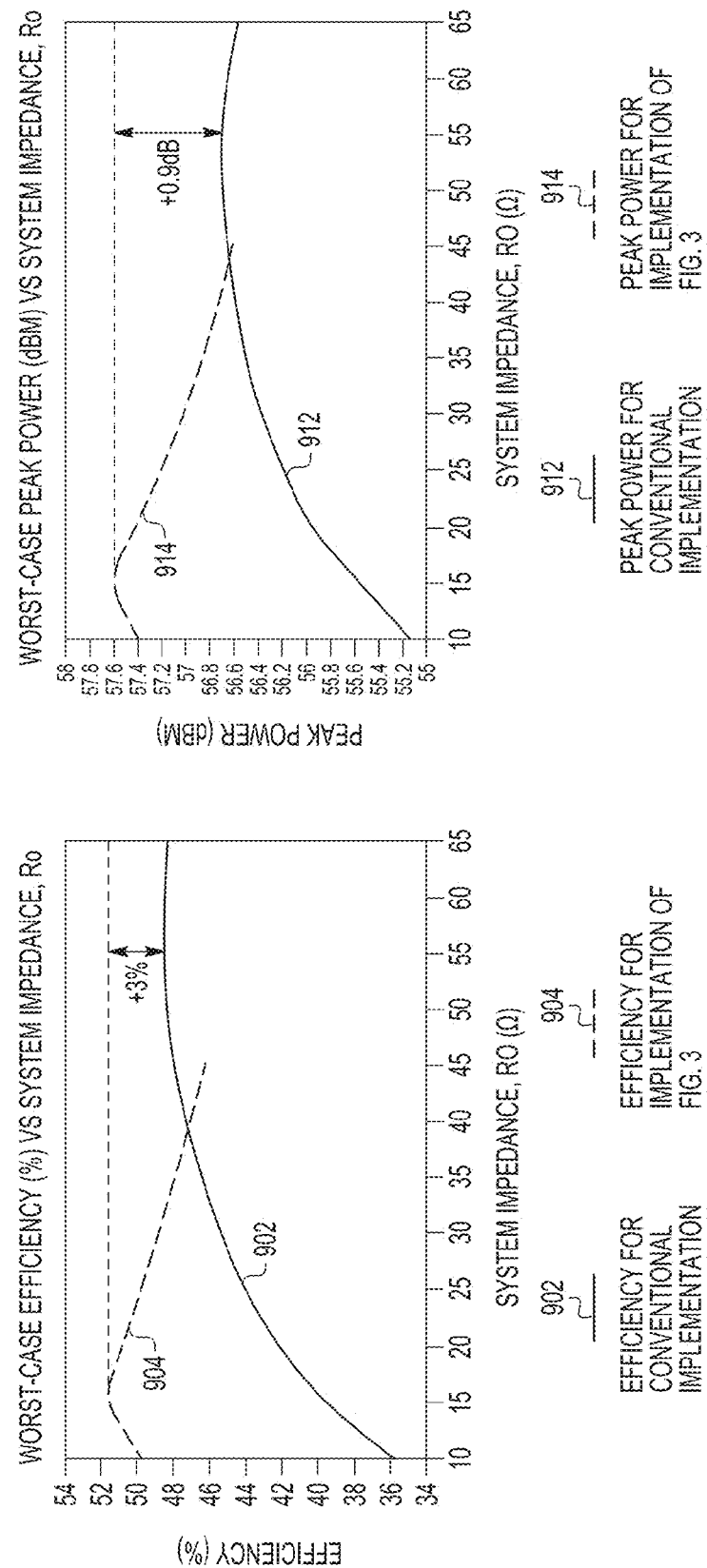
FIGS. 11A and 11B illustrate graphs depicting example worst-case efficiency and peak power of a Doherty amplifier device in which the present disclosure is implemented and, for the purposes of comparison, a representative conventionally configured Doherty amplifier device.

FIG. 11A depicts example worst-case efficiency and FIG. 11B depicts peak power of a Doherty amplifier device implementation like that shown in FIG. 3 in which the present disclosure is implemented, as compared with a conventionally configured Doherty amplifier like that shown in FIG. 1. In this example, both devices are configured as 2:1 asymmetric Doherty amplifiers where the peaking device contributes twice the output power of the main device at the peak power condition (n=2). The combined peak power of each device is configured to be around 750 W at the main and peaking device reference planes (in other words, at the output of main device 306 and peaking device 308 of the device shown in FIG. 3, and at the output of main device 106 and peaking device 108 of the device shown in FIG. 1). Calculations for the worst-case peak power and efficiency over a band of interest (1805 MHz to 2200 MHZ in this example) are based on the resulting VSWR characteristics for main and peaking devices over the band of interest at peak power and for main device at back-off power. The VSWR characteristics are referenced to the band center frequency target impedance for the main device at peak power (Zopt), band center target impedance for peaking device at peak power (Zpeak), and band center target impedance for main device at the back-off region (Zmod). In this example, system impedance R0 was swept over a wide range to find the optimum system impedance providing highest worst-case efficiency over the band of interest. For this example, an optimum R0 value was found in the 15 to 20 Ohm range for the presently disclosed device. It can be seen that the presently disclosed device maintains a VSWR up to 1.2 at back-off power over 600 MHz bandwidth, and the presently disclosed device maintains a VSWR up to 1.2 over 400 MHz bandwidth at peak power. By comparison, an optimum system impedance R0 value for a conventionally configured Doherty amplifier device, similar to that shown in FIG. 1, was found to be around 55 Ohms, where a VSWR up to 1.2 was maintained over 400 MHz bandwidth at back-off power, and a VSWR up to 1.2 was maintained over 175 MHz bandwidth at peak power. At peak power, the bandwidth performance of the peaking device is more critical than the main device, due to this example implementing a 2:1 asymmetric Doherty power amplifier device, where the peaking device will contribute twice the output power than the main device.

As shown in FIG. 11A, the worst-case efficiency for the conventionally configured device (shown as curve 902) peaks around 55 ohms and the worst-case efficiency for the presently disclosed device (shown as curve 904) peaks around 15 ohms, where the presently disclosed device achieves a 3% higher efficiency capability over a 400 MHz bandwidth, as compared to the conventionally configured device. As shown in FIG. 11B, the worst-case peak power for the conventionally configured device (shown as curve 912) peaks around 55 ohms and the worst-case peak power for the presently disclosed device (shown as curve 914) peaks around 15 ohms, where the presently disclosed device achieves a 0.9 dB higher peak power capability over a 400 MHz bandwidth, as compared to the conventionally configured device.

By now it should be appreciated that there has been provided a number of Doherty output network solutions that optimally distribute VSWR seen at back-off power and high power regions, that implement a compact, minimum phase output combiner network that minimizes circuit losses, and provides optimal power scaling properties. Some advantages of the disclosed architecture include a reduction of VSWR by a factor of $\sqrt{(n+1)}$ at the low power, back-off condition that in turn reduces efficiency dispersion, and a reduction of load impedance dispersion of the peaking device in the peak power condition, which is especially beneficial for asymmetric Doherty power amplifiers with a higher peaking to main power ratio.

In one embodiment of the present disclosure, a Doherty amplifier device is provided, which includes: a main amplifier that produces a first radio frequency (RF) output signal at a main amplifier output corresponding to a main amplifier intrinsic current generator plane, wherein the main amplifier produces the first RF output signal with a variable first output power; a peaking amplifier that produces a second RF output signal at a peaking amplifier output corresponding to a peaking amplifier intrinsic current generator plane, wherein the peaking amplifier produces the second RF output signal with a variable second output power equivalent to the first output power multiplied by a power ratio n that is greater than one; a combining node, wherein a first radio frequency (RF) signal output by the main amplifier and a second RF signal output by the peaking amplifier are combined at the combining node in phase; and a main output matching network (OMN), wherein an input of the main OMN is coupled to the main amplifier output, and an output of the main OMN is coupled to the combining node, wherein the main OMN forms a portion of an equivalent main path transmission line having a characteristic impedance that is equivalent to $$\sqrt{(n+1) \cdot Ropt \cdot R0},$$

wherein Ropt is a load impedance seen at the main amplifier intrinsic current generator plane during a full power condition of the Doherty amplifier device and R0 is a load impedance seen at the combining node during a back-off power condition of the Doherty amplifier device, and wherein the main OMN forms a portion of a 90 degree phase delay between the main amplifier intrinsic current generator plane and the combining node.

One aspect of the above embodiment provides that a voltage standing wave ratio (VSWR) seen by the main path during a back-off power operating condition of the Doherty amplifier device is equivalent to $$\sqrt{(n+1)} : 1.$$

Another aspect of the above embodiment provides that a voltage standing wave ratio (VSWR) seen by the main path during the full power operating condition of the Doherty amplifier device is equivalent to $$\sqrt{(n+1)} : 1.$$

Another aspect of the above embodiment provides that the main OMN is implemented as an impedance inverter.

Another aspect of the above embodiment provides that the main amplifier is matched to a target impedance equivalent to $$\sqrt{(n+1)} \cdot Ropt.$$

Another aspect of the above embodiment provides that the main amplifier is matched to a target impedance equivalent to $$\sqrt{(n+1)} \cdot R0.$$

Another aspect of the above embodiment provides that the main amplifier is matched to a target impedance that includes a geometric mean value of a first load impedance seen at the output of the main OMN during the full power operating condition of the Doherty amplifier device and a second load impedance seen at the output of the main OMN during the back-off power operating condition of the Doherty amplifier device.

A further aspect of the above embodiment provides that the first load impedance seen during the full power operating condition includes $(n+1) \cdot R0$, and the second load impedance seen during the back-off power operating condition includes $R0$.

Another aspect of the above embodiment provides that the characteristic impedance of the equivalent main path transmission line includes the main OMN in combination with an internal circuit of the main amplifier.

Another aspect of the above embodiment provides that the combining node is connectable to an RF load network consisting of an output impedance transformer connected to an RF load, wherein the output impedance transformer imparts a 90 degree phase delay between the combining node and the RF load.

Another aspect of the above embodiment provides that the peaking amplifier is configured to receive a first RF input signal, and the main amplifier is configured to receive a second RF input signal that is delayed from the first RF input signal by 90 degrees.

Another aspect of the above embodiment provides that the Doherty amplifier device further includes: a peaking OMN, wherein an input of the peaking OMN is coupled to the peaking amplifier output, and an output of the peaking OMN is coupled to an intermediate node, wherein the peaking OMN forms a portion of an equivalent peaking path transmission line having a characteristic impedance that is equivalent to $$\sqrt{Ropt \cdot R0} \cdot 1/n,$$

and wherein the peaking OMN forms a portion of a 90 degree phase delay between the peaking amplifier intrinsic current generator plane and the intermediate node; and an impedance transformer having a first terminal coupled to the intermediate node and a second terminal coupled to the combining node, wherein the impedance transformer has a characteristic impedance equivalent to $$\sqrt{(n+1)} \cdot R0/n,$$

and wherein the impedance transformer provides a 90 degree phase delay between the intermediate node and the combining node.

A further aspect of the above embodiment provides that a voltage standing wave ratio (VSWR) seen by the peaking path during the full power operating condition of the Doherty amplifier device is equivalent to $$\sqrt{(n+1)} : 1.$$

Another further aspect of the above embodiment provides that the peaking amplifier is matched to a target impedance equivalent to $$\sqrt{(n+1)} \cdot R0/n.$$

Another further aspect of the above embodiment provides that the characteristic impedance of the equivalent peaking path transmission line includes the peaking OMN in combination with an internal circuit of the peaking amplifier.

Another aspect of the above embodiment provides that the Doherty amplifier device further includes: a peaking OMN, wherein an input of the peaking OMN is coupled to the peaking amplifier output, and an output of the peaking OMN is coupled to an intermediate node, wherein the peaking OMN forms a portion of an equivalent peaking path transmission line having a characteristic impedance that is equivalent to $$\sqrt{(n+1) \cdot Ropt \cdot R0} \cdot 1/n,$$

and wherein the peaking OMN forms a portion of a 180 degree phase delay between the peaking amplifier intrinsic current generator plane and the combining node; and a delay line having a first terminal coupled to the intermediate node and a second terminal coupled to the combining node, wherein the delay line has a characteristic impedance equivalent to $(n+1) \cdot R0/n$, and wherein the delay line provides a portion of the 180 degree phase delay between the peaking amplifier intrinsic current generator plane and the combining node.

A further aspect of the above embodiment provides that a voltage standing wave ratio (VSWR) seen by the peaking path during the full power operating condition of the Doherty amplifier device is equivalent to 1:1.

Another further aspect of the above embodiment provides that the peaking amplifier is matched to a target impedance equivalent to $(n+1) \cdot R0/n$.

Another aspect of the above embodiment provides that the Doherty amplifier device further includes: a peaking OMN, wherein an input of the peaking OMN is coupled to the peaking amplifier output, and an output of the peaking OMN is coupled to an intermediate node, wherein the peaking OMN forms a portion of an equivalent peaking path transmission line having a characteristic impedance that is equivalent to $$(n+1)^{1/4} \cdot Ropt^{3/4} \cdot R0^{1/4} \cdot 1/n,$$

and wherein the peaking OMN forms a portion of a 90 degree phase delay between the peaking amplifier intrinsic current generator plane and the intermediate node; and an impedance transformer having a first terminal coupled to the intermediate node and a second terminal coupled to the combining node, wherein the impedance transformer has a characteristic impedance equivalent to $$(n+1)^{3/4} \cdot Ropt^{1/4} \cdot R0^{3/4} \cdot 1/n,$$

and wherein the impedance transformer provides a 90 degree phase delay between the intermediate node and the combining node.

A further aspect of the above embodiment provides that a voltage standing wave ratio (VSWR) seen by the peaking path during the full power operating condition of the Doherty amplifier device is equivalent to $$(n+1)^{1/4} \cdot Ropt^{-1/4} \cdot R0^{1/4} : 1.$$

Another further aspect of the above embodiment provides that the peaking amplifier is matched to a target impedance equivalent to $$(n+1)^{3/4} \cdot Ropt^{1/4} \cdot R0^{3/4} \cdot 1/n.$$

In some embodiments, the main and peaking devices of the disclosed Doherty amplifier architecture may be implemented as an integrated circuit on a semiconductor die or semiconductor substrate. Components of the power splitter, phase shifter, main and peaking input matching networks, the main and peaking output matching networks, Doherty combiner, and output impedance transformer may be implemented on the semiconductor die that includes the main and peak device, may be implemented off of the semiconductor die that includes the main and peak devices, or a combination thereof.

The semiconductor die that includes the main and peaking devices may be attached to an underlying carrier substrate, such as a printed circuit board (PCB) that includes electrically conductive features on a non-conductive substrate, and may be formed using for example polyimide or FR4 or BT resin. In some embodiments, components of the power splitter, phase shifter, main and peaking input matching networks, the main and peaking output matching networks, Doherty combiner, and output impedance transformer may be implemented on the carrier substrate itself (e.g., as another integrated circuit). In other embodiments, components of the power splitter, phase shifter, main and peaking input matching networks, the main and peaking output matching networks, Doherty combiner, and output impedance transformer may be implemented on another semiconductor die that is attached to the carrier substrate. The components of the Doherty amplifier device may also be composed of a combination of discrete components mounted on a PCB and transmission lines etched into the PCB. Main and peaking amplifier devices may themselves also be discrete packaged components.

Examples of a semiconductor die or integrated circuit that includes main and peaking devices can be any semiconductor material or combinations of materials, such as gallium arsenide, gallium nitride, silicon germanium, silicon-on-insulator (SOI), silicon, monocrystalline silicon, the like, and combinations of the above. The integrated circuitry on the semiconductor die is formed using a sequence of numerous process steps applied to the semiconductor die (e.g., in wafer form), including but not limited to depositing semiconductor materials including dielectric materials and metals, such as growing, oxidizing, sputtering, and conformal depositing, etching semiconductor materials, such as using a wet etchant or a dry etchant, planarizing semiconductor materials, such as performing chemical mechanical polishing or planarization, performing photolithography for patterning, including depositing and removing photolithography masks or other photoresist materials, ion implantation, annealing, and the like. The integrated circuitry on the semiconductor die implements an integrated circuit (which may include main and peaking devices), where example components of integrated circuitry include but are not limited to dielectric materials with conductive structures, pads, interconnects, analog circuitry, digital logic, standalone discrete devices such as resistors, inductors, capacitors, diodes, power transistors, the like, and combinations thereof.

As used herein, a "node" means any internal or external reference point, connection point, junction, signal line, conductive element, or the like, at which a given signal, logic level, voltage, data pattern, current, or quantity is present. Furthermore, two or more nodes may be realized by one physical element (and two or more signals can be multiplexed, modulated, or otherwise distinguished even though received or output at a common mode).

The following description refers to nodes or features being "connected" or "coupled" together. As used herein, unless expressly stated otherwise, "coupled" means that one node or feature is directly or indirectly joined to (or is in direct or indirect communication with) another node or feature, and not necessarily physically. As used herein, unless expressly stated otherwise, "connected" means that one node or feature is directly joined to (or is in direct communication with) another node of feature. For example, a switch may be "coupled to a plurality of nodes, but all of those nodes need not always be "connected" to each other; the switch may connect different nodes to each other depending upon the state of the switch. Furthermore, although the various schematics shown herein depict certain example arrangements of elements, additional intervening elements, devices, features, or components may be present in an actual embodiment (assuming that the functionality of the given circuit is not adversely affected).

Because the apparatus implementing the present invention is, for the most part, composed of electronic components and circuits known to those skilled in the art, circuit details will not be explained in any greater extent than that considered necessary as illustrated above, for the understanding and appreciation of the underlying concepts of the present invention and in order not to obfuscate or distract from the teachings of the present invention.

As used herein, the terms "substantial" and "substantially" mean sufficient to achieve the stated purpose or value in a practical manner, taking into account any minor imperfections or deviations, if any, that arise from usual and expected process abnormalities that may occur during fabrication of the devices discussed herein, which are not significant for the stated purpose or value. As also used herein, the term "equivalent to" may mean equal to, such as one value being equal to another value, and may also mean substantially equal to, such as one value being within a tolerance threshold of another value, where variation within the tolerance threshold achieves the stated purpose or value in a practical manner.

Although the invention is described herein with reference to specific embodiments, various modifications and changes can be made without departing from the scope of the present invention as set forth in the claims below. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

What is claimed is:

1. A Doherty amplifier device comprising:
 a main amplifier that produces a first radio frequency (RF) output signal at a main amplifier output corresponding to a main amplifier intrinsic current generator plane, wherein the main amplifier produces the first RF output signal with a variable first output power;
 a peaking amplifier that produces a second RF output signal at a peaking amplifier output corresponding to a peaking amplifier intrinsic current generator plane, wherein the peaking amplifier produces the second RF output signal with a variable second output power equivalent to the first output power multiplied by a power ratio n that is greater than one;
 a combining node, wherein a first radio frequency (RF) signal output by the main amplifier and a second RF signal output by the peaking amplifier are combined at the combining node in phase; and
 a main output matching network (OMN), wherein an input of the main OMN is coupled to the main amplifier output, and an output of the main OMN is coupled to the combining node, wherein the main OMN forms a portion of an equivalent main path transmission line having a characteristic impedance that is equivalent to $$\sqrt{(n+1) \cdot Ropt \cdot R0},$$

wherein Ropt is a load impedance seen at the main amplifier intrinsic current generator plane during a full power condition of the Doherty amplifier device and R0 is a load impedance seen at the combining node during a back-off power condition of the Doherty amplifier device, and wherein the main OMN forms a portion of a 90 degree phase delay between the main amplifier intrinsic current generator plane and the combining node.

2. The Doherty amplifier device of claim 1, wherein a voltage standing wave ratio (VSWR) seen by the main path during a back-off power operating condition of the Doherty amplifier device is equivalent to $$\sqrt{(n+1)} : 1.$$

3. The Doherty amplifier device of claim 1, wherein a voltage standing wave ratio (VSWR) seen by the main path during the full power operating condition of the Doherty amplifier device is equivalent to $$\sqrt{(n+1)} : 1.$$

4. The Doherty amplifier device of claim 1, wherein the main OMN is implemented as an impedance inverter.

5. The Doherty amplifier device of claim 1, wherein the main amplifier is matched to a target impedance equivalent to $$\sqrt{(n+1) \cdot Ropt}.$$

6. The Doherty amplifier device of claim 1, wherein the main amplifier is matched to a target impedance equivalent to $$\sqrt{(n+1) \cdot R0}.$$

7. The Doherty amplifier device of claim 1, wherein the main amplifier is matched to a target impedance that comprises a geometric mean value of a first load impedance seen at the output of the main OMN during the full power operating condition of the Doherty amplifier device and a second load impedance seen at the output of the main OMN during the back-off power operating condition of the Doherty amplifier device.

8. The Doherty amplifier device of claim 7, wherein the first load impedance seen during the full power operating condition comprises (n+1)·R0, and the second load impedance seen during the back-off power operating condition comprises R0.

9. The Doherty amplifier device of claim 1, wherein the characteristic impedance of the equivalent main path transmission line includes the main OMN in combination with an internal circuit of the main amplifier.

10. The Doherty amplifier device of claim 1, wherein the combining node is connectable to an RF load network consisting of an output impedance transformer connected to an RF load, wherein the output impedance transformer imparts a 90 degree phase delay between the combining node and the RF load.

11. The Doherty amplifier device of claim 1, wherein the peaking amplifier is configured to receive a first RF input signal, and
the main amplifier is configured to receive a second RF input signal that is delayed from the first RF input signal by 90 degrees.

12. The Doherty amplifier device of claim 1, further comprising:
a peaking OMN, wherein an input of the peaking OMN is coupled to the peaking amplifier output, and an output of the peaking OMN is coupled to an intermediate node,
wherein the peaking OMN forms a portion of an equivalent peaking path transmission line having a characteristic impedance that is equivalent to $$\sqrt{Ropt \cdot R0} \cdot 1/n,$$

and
wherein the peaking OMN forms a portion of a 90 degree phase delay between the peaking amplifier intrinsic current generator plane and the intermediate node; and
an impedance transformer having a first terminal coupled to the intermediate node and a second terminal coupled to the combining node,
wherein the impedance transformer has a characteristic impedance equivalent to $$\sqrt{(n+1) \cdot R0/n},$$

and wherein the impedance transformer provides a 90 degree phase delay between the intermediate node and the combining node.

13. The Doherty amplifier device of claim 12, wherein a voltage standing wave ratio (VSWR) seen by the peaking path during the full power operating condition of the Doherty amplifier device is equivalent to $$\sqrt{(n+1)} : 1.$$

14. The Doherty amplifier device of claim 12, wherein the peaking amplifier is matched to a target impedance equivalent to $$\sqrt{(n+1) \cdot R0/n}.$$

15. The Doherty amplifier device of claim 12, wherein the characteristic impedance of the equivalent peaking path transmission line includes the peaking OMN in combination with an internal circuit of the peaking amplifier.

16. The Doherty amplifier device of claim 1, further comprising:
a peaking OMN, wherein an input of the peaking OMN is coupled to the peaking amplifier output, and an output of the peaking OMN is coupled to an intermediate node,
wherein the peaking OMN forms a portion of an equivalent peaking path transmission line having a characteristic impedance that is equivalent to $$\sqrt{(n+1) \cdot Ropt \cdot R0} \cdot 1/n,$$

and
wherein the peaking OMN forms a portion of a 180 degree phase delay between the peaking amplifier intrinsic current generator plane and the combining node; and
a delay line having a first terminal coupled to the intermediate node and a second terminal coupled to the combining node,
wherein the delay line has a characteristic impedance equivalent to $(n+1) \cdot R0/n$, and
wherein the delay line provides a portion of the 180 degree phase delay between the peaking amplifier intrinsic current generator plane and the combining node.

17. The Doherty amplifier device of claim 16, wherein a voltage standing wave ratio (VSWR) seen by the peaking path during the full power operating condition of the Doherty amplifier device is equivalent to 1:1.

18. The Doherty amplifier device of claim 16, wherein the peaking amplifier is matched to a target impedance equivalent to $(n+1) \cdot R0/n$.

19. The Doherty amplifier device of claim 1, further comprising:
a peaking OMN, wherein an input of the peaking OMN is coupled to the peaking amplifier output, and an output of the peaking OMN is coupled to an intermediate node,
wherein the peaking OMN forms a portion of an equivalent peaking path transmission line having a characteristic impedance that is equivalent to $$(n+1)^{1/4} \cdot Ropt^{3/4} \cdot R0^{1/4} \cdot 1/n,$$

and
wherein the peaking OMN forms a portion of a 90 degree phase delay between the peaking amplifier intrinsic current generator plane and the intermediate node; and
an impedance transformer having a first terminal coupled to the intermediate node and a second terminal coupled to the combining node,
wherein the impedance transformer has a characteristic impedance equivalent to $$(n+1)^{3/4} \cdot Ropt^{1/4} \cdot R0^{3/4} \cdot 1/n,$$

and wherein the impedance transformer provides a 90 degree phase delay between the intermediate node and the combining node.

20. The Doherty amplifier device of claim 19, wherein a voltage standing wave ratio (VSWR) seen by the peaking path during the full power operating condition of the Doherty amplifier device is equivalent to $$(n+1)^{1/4} \cdot Ropt^{-1/4} \cdot R0^{1/4} : 1.$$

21. The Doherty amplifier device of claim 19, wherein the peaking amplifier is matched to a target impedance equivalent to $$(n+1)^{3/4} \cdot Ropt^{1/4} \cdot R0^{3/4} \cdot 1/n.$$

* * * * *